(12) United States Patent
Lee

(10) Patent No.: US 10,102,893 B2
(45) Date of Patent: Oct. 16, 2018

(54) SYSTEMS FOR IMPLEMENTING WORD LINE PULSE TECHNIQUES IN MAGNETOELECTRIC JUNCTIONS

(71) Applicant: Inston Inc., Santa Monica, CA (US)

(72) Inventor: Hochul Lee, Los Angeles, CA (US)

(73) Assignee: Inston Inc., Santa Monica, CA (US)

( * ) Notice: Subject to any disclaimer, the term of this patent is extended or adjusted under 35 U.S.C. 154(b) by 0 days.

(21) Appl. No.: 15/636,568

(22) Filed: Jun. 28, 2017

(65) Prior Publication Data

US 2017/0372762 A1    Dec. 28, 2017

Related U.S. Application Data

(60) Provisional application No. 62/355,710, filed on Jun. 28, 2016.

(51) Int. Cl.
  *G11C 11/00*  (2006.01)
  *G11C 11/16*  (2006.01)
  (Continued)

(52) U.S. Cl.
  CPC ........ *G11C 11/161* (2013.01); *G11C 11/1655* (2013.01); *G11C 11/1657* (2013.01);
  (Continued)

(58) Field of Classification Search
  CPC .............. G11C 11/161; G11C 11/1657; G11C 11/1673; G11C 11/1675; G11C 11/16;
  (Continued)

(56) References Cited

U.S. PATENT DOCUMENTS 4,038,596 A   7/1977  Lee
6,040,996 A   3/2000  Kong
  (Continued)

FOREIGN PATENT DOCUMENTS

WO   2012159078 A2   11/2012
WO   2012159078 A3    3/2013
  (Continued)

OTHER PUBLICATIONS

Akinwande et al., "Two-dimensional flexible nanoelectronics", Nature Communications, Dec. 17, 2014, vol. 5, pp. 1-12.
  (Continued)

*Primary Examiner* — Thong Q Le
(74) *Attorney, Agent, or Firm* — KPPB LLP

(57) ABSTRACT

Systems and methods for performing word line pulse techniques in magnetoelectric junctions in accordance with embodiments of the invention are disclosed. In one embodiment, a magnetoelectric random access memory (MeRAM) circuit, including, a plurality of voltage controlled magnetic tunnel junction bits (MEJs) each magnetoelectric junction connected to the drain of an MOS transistor, the combination including three terminals, each connected to a bit, source, and at least one word line, in an array, and a driver circuit, including a bit line driver, and a word line driver the bit line driver, the driver circuit generates voltage pulses for application to the magnetoelectric junction bit, the output of the driver circuit is connected to the word line, which in turn is connected to the gate of the MOS access transistor in each MeRAM cell, thereby generating a square voltage pulse across the magnetoelectric junction bit.

17 Claims, 11 Drawing Sheets

(51) Int. Cl.
  *H01L 27/22* (2006.01)
  *H01L 43/08* (2006.01)
  *H01L 43/10* (2006.01)

(52) U.S. Cl.
  CPC ............ *H01L 27/228* (2013.01); *H01L 43/08* (2013.01); *H01L 43/10* (2013.01)

(58) Field of Classification Search
  CPC ..... G11C 11/1659; G11C 7/14; G11C 11/165; G11C 13/0004; G11C 13/0007; G11C 13/0021; G11C 2213/71; G11C 2213/72; G11C 5/02; G11C 11/1655
  USPC ........ 365/158, 171, 173, 209, 210.1, 210.11, 365/210.12, 210.15, 157, 189.07, 210.14, 365/214
  See application file for complete search history.

(56) References Cited

U.S. PATENT DOCUMENTS

| | | | |
|---|---|---|---|
| 6,114,719 | A | 9/2000 | Dill et al. |
| 6,292,395 | B1 | 9/2001 | Lin et al. |
| 6,529,412 | B1 | 3/2003 | Chen et al. |
| 6,791,897 | B2 | 9/2004 | Choi et al. |
| 7,057,921 | B2 | 6/2006 | Valet et al. |
| 7,282,755 | B2 | 10/2007 | Pakala et al. |
| 7,403,442 | B2 | 7/2008 | Larguier et al. |
| 7,480,172 | B2 | 1/2009 | Shi et al. |
| 8,213,234 | B2 | 7/2012 | Chen et al. |
| 8,482,968 | B2 | 7/2013 | Worledge et al. |
| 8,760,930 | B1 | 6/2014 | Kushnarenko et al. |
| 8,804,425 | B2 | 8/2014 | Chen et al. |
| 8,841,739 | B2 | 9/2014 | Amiri et al. |
| 8,885,395 | B2 | 11/2014 | Malmhall et al. |
| 8,891,291 | B2 | 11/2014 | Huai et al. |
| 9,099,641 | B2 | 8/2015 | Amiri et al. |
| 9,129,691 | B2 | 9/2015 | Amiri et al. |
| 9,240,799 | B1 | 1/2016 | Wang et al. |
| 9,324,403 | B2 | 4/2016 | Amiri et al. |
| 9,355,699 | B2 | 5/2016 | Amiri et al. |
| 9,361,975 | B2 | 6/2016 | Gilbert et al. |
| 2002/0057594 | A1 | 5/2002 | Hirai |
| 2004/0241394 | A1 | 12/2004 | Burrows |
| 2005/0036361 | A1 | 2/2005 | Fukuzumi et al. |
| 2005/0062082 | A1 | 3/2005 | Bucher et al. |
| 2006/0133137 | A1 | 6/2006 | Shin et al. |
| 2006/0239110 | A1 | 10/2006 | Ueda et al. |
| 2007/0183190 | A1 | 8/2007 | Eyckmans et al. |
| 2009/0046529 | A1 | 2/2009 | Chen et al. |
| 2010/0080048 | A1 | 4/2010 | Liu et al. |
| 2010/0155687 | A1 | 6/2010 | Reyes et al. |
| 2010/0277974 | A1 | 11/2010 | Yang |
| 2011/0051502 | A1 | 3/2011 | Rao et al. |
| 2011/0260224 | A1 | 10/2011 | Hidaka |
| 2012/0176831 | A1 | 7/2012 | Xiao et al. |
| 2013/0015542 | A1 | 1/2013 | Wang et al. |
| 2013/0200323 | A1 | 8/2013 | Pham et al. |
| 2013/0343117 | A1 | 12/2013 | Lua et al. |
| 2014/0070344 | A1 | 3/2014 | Amiri et al. |
| 2014/0071728 | A1 | 3/2014 | Khalili et al. |
| 2014/0071732 | A1 | 3/2014 | Khalili et al. |
| 2014/0124882 | A1 | 5/2014 | Amiri et al. |
| 2014/0159121 | A1 | 6/2014 | Fukami et al. |
| 2014/0169085 | A1 | 6/2014 | Wang et al. |
| 2014/0177327 | A1 | 6/2014 | Amiri et al. |
| 2014/0197459 | A1 | 7/2014 | Kis et al. |
| 2014/0247653 | A1 | 9/2014 | Wang et al. |
| 2014/0334216 | A1 | 11/2014 | Wang et al. |
| 2015/0064492 | A1 | 3/2015 | Rasic et al. |
| 2015/0122315 | A1 | 5/2015 | Shin et al. |
| 2015/0137289 | A1 | 5/2015 | Khalili |
| 2015/0249096 | A1* | 9/2015 | Lupino ............ H01L 27/11898 257/203 |
| 2015/0332749 | A1 | 11/2015 | Khalili et al. |
| 2016/0027842 | A1 | 1/2016 | Khalili et al. |
| 2016/0197263 | A1 | 7/2016 | Hu |
| 2016/0204162 | A1 | 7/2016 | Hu et al. |
| 2016/0240771 | A1 | 8/2016 | Hu |
| 2016/0358973 | A1 | 12/2016 | Katine et al. |
| 2017/0033281 | A1 | 2/2017 | Hu |
| 2017/0084322 | A1 | 3/2017 | Wang et al. |
| 2017/0323929 | A1 | 11/2017 | Bessonov et al. |
| 2017/0372761 | A1 | 12/2017 | Lee |

FOREIGN PATENT DOCUMENTS

| | | |
|---|---|---|
| WO | 2018005698 A1 | 1/2018 |
| WO | 2018005699 A1 | 1/2018 |

OTHER PUBLICATIONS

Alzate et al., "Voltage-Induced Switching of CoFeB—MgO Magnetic Tunnel Junctions", 56th Conference on Magnetism and Magnetic Materials, Scottsdale, Arizona, USA, EG-11 (Jan. 1, 2011), 5 pgs.

Alzate et al., "Voltage-induced switching of nanoscale magnetic tunnel junctions", Conference Paper in Electron Devices Meeting, 1988. IEDM '88. Technical Digest, International, Jan. 16, 2012, 5 pgs.

Amiri et al., "Electric-Field-Controlled Magnetoelectric RAM: Progress, Challenges, and Scaling", IEEE Transactions on Magnetics, Jun. 10, 2015, vol. 51, No. 11, 7 pgs.

Amiri et al., "Electric-field-induced thermally assisted switching of monodomain magnetic bits", Journal of Applied Physics, Jan. 1, 2013, vol. 113. pp. 013912-1-013912-5.

Amiri et al., "Switching current reduction using perpendicular anisotropy in CoFeB—MgO magnetic tunnel junctions", Applied Physics Letters, Mar. 1, 2011, vol. 98, pp. 112507-1-112507-3.

Amiri et al., "Voltage-Controlled Magnetic Anisotropy in Spintronic Devices", Spin, Oct. 29, 2012, vol. 2, No. 3, pp. 1240002-1-1240002-9.

Bae et al., "Roll-to-roll production of 30-inch graphene films for transparent electrodes", Nature Nanotechnology, published online Jun. 20, 2010, vol. 5, pp. 574-578.

Britnell et al., "Resonant tunnelling and negative differential conductance in graphene transistors", Nature Communications, Apr. 30, 2013, vol. 4, 5 pgs.

Britnell et al., "Strong Light-Matter Interactions in Heterostructures of Atomically Thin Films", Science, Jun. 14, 2013, vol. 340, pp. 1311-1314.

Brown, "Thermal Fluctuations of a Single-Domain Particle", Physical Review, Jun. 1, 1963, vol. 130, No. 5, pp. 1677-1686.

Buscema et al., "Photovoltaic effect in few-layer black phosphorus PN junctions defined by local electrostatic gating", Nature Communications, Aug. 28, 2014, vol. 5, 6 pgs.

Butler et al., "Progress, Challenges, and Opportunities in Two-Dimensional Materials Beyond Graphene", ACSNano, Mar. 6, 2013, vol. 7, No. 4, pp. 2898-2926.

Chang et al., "A 0.5V 4Mb Logic-Process compatible Embedded Resistive RAM (ReRAM( in 65nm CMOS Using Low-voltage Current-Mode Sensing Scheme with 45ns Random Read Time", 2012 IEEE International solid-State Circuits Conference, ISSCC 2012, Feb. 22, 2012, pp. 434-436.

Chatterjee et al., "Dual-Source-Line-Bias Scheme to Improve the Read Margin and Sensing Accuracy of STTRAM in Sub-90-nm Nodes", IEEE Transactions on Circuits and Systems—II: Express Briefs, Mar. 10, 2010, vol. 57, No. 3, pp. 208-212.

Chen et al., "A 40 nm fully Functional SRAM with BL Swing and WL Pulse Measurement Scheme for Eliminating a Need for Additional Sensing Tolerance Margins", 2011 Symposium on VLSI Circuits Digest of Technical Papers, Jun. 15, 2011, pp. 70-71.

Chen et al., "Compact Measurement Schemes for Bit-Line Swing, Sense Amplifier Offset Voltage, and Word-Line Pulse Width to Characterize Sensing Tolerance Margin in a 30 nm Fully Functional Embedded SRAM", IEEE Journal of Solid-State Circuits, Feb. 13, 2012, vol. 47, No. 4, pp. 969-980.

(56) References Cited

OTHER PUBLICATIONS

Choi et al., "Lateral MoS2 p-n Junction Formed by Chemical Doping for Use in High-Performance Optoelectronics", ACSNano, Aug. 18, 2014, vol. 8, No. 9, pp. 9332-9340.
Dorrance et al., "Diode-MTJ Crossbar Memory Cell Using Voltage-Induced Unipolar Switching for High-Density MRAM", IEEE Electron Device Letters, May 3, 2013, vol. 34, No. 6, pp. 753-755.
Fukada et al., "Non-volatile Random Access Memory and NAND Flash Memory Integrated Solid-State Drives with Adaptive Codeword Error Correcting Code for 3.6 Times Acceptable Raw Bit Error Rate Enhancement and 97% Power Reduction", Japanese Journal of Applied Physics, Apr. 20, 2011, vol. 50, pp. 04DE09-1-04DE09-7.
Furchi et al., "Photovoltaic Effect in an Electrically Tunable van der Waals Heterojunction", Nano Letters, Jul. 24, 2014, vol. 14, pp. 4785-4791.
Geim et al., "Van der Waals heterostructures", Nature, Jul. 25, 2013, vol. 499, pp. 419-425.
Georgiou et al., "Vertical field-effect transistor based on graphene-WS2 heterostructures for flexible and transparent electronics", Letters Nature Nanotechnology, published online Dec. 23, 2012, vol. 8, pp. 100-103.
Grezes et al., "Ultra-low switching energy and scaling in electric-field-controlled nanoscale magnetic tunnel junctions with high resistance-area product", Applied Physics Letters, Jan. 1, 2016, vol. 108, pp. 012403-1-012403-5.
Haigh, S. J., "Cross-sectional imaging of individual layers and buried interfaces of graphene-based heterostructures and superlattices", Letters Nature Materials, published online Jul. 29, 2012, Sep. 20112, vol. 11, pp. 764-767.
Halupka et al., "Negative-Resistance Read and Write Schemes for SST-MRAM in 0.13μm CMOS", 2010 IEEE International Solid-State Circuits Conference, ISSCC 2010, Feb. 9, 2010, pp. 256-258.
Huai et al., "Observation of spin-transfer switching in deep submicron-sized and low-resistance magnetic tunnel junctions", Applied Physics Letter, Apr. 19, 2004, vol. 84, No. 16, pp. 3118-3120.
Huang, J.-K. et al., "Large-Area Synthesis of Highly Crystalline WSe2 Monolayers and Device Applications", ACSNano, published online Dec. 14, 2013, vol. 8, No. 1, pp. 923-930.
Ikeda et al., "A perpendicular-anistrophy CoFeB-MgO magnetic tunnel junction", Nature Materials, Sep. 2010 (published online Jul. 11, 2010), vol. 9, pp. 721-724.
Ikegami et al., "MTJ-Based "Normally-Off Processors" with Thermal Stability Factor Engineered Perpendicular MTJ, L2 Cache Based on 2T-2MTJ Cell, L3 and Last Level Cache Based on 1T-1MTJ Cell and Novel Error Handling Scheme", 2015 IEEE International Electron Devices Meeting (IEDM), Dec. 7, 2015, pp. 25.1.1-25.1.4.
Jariwala, D. et al., "Emerging Device Applications for Semiconducting Two-Dimensional Transition Metal Dichalcogenides", ACSNano, published online Jan. 29, 2013, vol. 8, No. 2, pp. 1102-1120.
Kalitsov et al., "Bias dependence of tunneling magnetoresistance in magnetic tunnel junctions with asymmetric barriers", Journal of Physics: Condensed Matter, Nov. 6, 2013, vol. 25, 496005, 8 pgs.
Kanai et al., "Electric field-induced magnetization reversal in a perpendicular-anisotropy CoFeB—MgO magnetic tunnel junction", Applied Physics Letters, Sep. 3, 2012, vol. 101, pp. 122403-1-122403-3.
Kanai et al., "Magnetization switching in a CoFeB/MgO magnetic tunnel junction by combining spin-transfer torque and electric field-effect", Applied Physics Letters, Jan. 1, 2014, vol. 104, pp. 212406-1-212406-3.
Kang et al., "High-Speed, Low-Power, Magnetic Non-Volatile Flip-Flop with voltage-Controlled, Magnetic Anisotropy Assistance", IEEE Magnetics Letters, Aug. 30, 2016, vol. 7, 5 pgs.
Katine et al., "Current-Driven magnetization Reversal and Spin-Wave Excitations in Co/Cu/Co Pillars", Physical Review Letters, Apr. 3, 2000, vol. 84, No. 14, pp. 3149-3152.
Katine et al., "Device implications of spin-transfer torques", Journal of Magnetism and Magnetic Materials, Apr. 7, 2008, vol. 320, pp. 1217-1226.
Kim et al., "Constant-Load Energy Recovery Memory for Efficient High-Speed Operation", ISLPED '04, Aug. 11, 2004, pp. 240-243.
Kobayashi, T. et al., "Production of a 100-m-long high-quality graphene transparent conductive film by roll-to-roll chemical vapor deposition and transfer process", Applied Physics Letters, Jan. 17, 2013, vol. 102, pp. 023112-1-023112-4.
Landau et al., "On the theory of the dispersion of magnetic permeability in ferromagnetic bodies", Ukr. J. Phys., May 11, 2008, vol. 53, Special Issue, pp. 14-22.
Lee, C.-H. et al., "Atomically thin p-n junctions with van der Waals heterointerfaces", Nature Nanotechnology, published online Aug. 10, 2014, vol. 9, pp. 676-681.
International Search Report and Written Opinion for International Application No. PCT/US2017/039832, Search completed Aug. 8, 2017, dated Aug. 29, 2017, 6 pgs.
International Search Report and Written Opinion for International Application No. PCT/US2017/039833, Search completed Aug. 22, 2017, dated Sep. 6, 2017, 22 pgs.
Lee, G.-H. et al., "Flexible and Transparent MoS2 Field-Effect Transistors on Hexagonal Boron Nitride-Graphene Heterostructures", ACSNano, published online Aug. 8, 2013, vol. 7, No. 9, pp. 7931-7936.
Lee, Y.-H. et al., "Synthesis of Large-Area MoS2 Atomic Layers with Chemical Vapor Deposition", Advanced Materials, Mar. 30, 2012, vol. 24, pp. 2320-2325.
Lee et al., "A Word Line Pulse Circuit Technique for Reliable Magnetoelectric Random Access Memory", IEEE Transactions on Very Large Scale Integration (VLSI) Systems, Jul. 7, 2017, vol. 25, No. 7, pp. 2027-2034.
Lee et al., "Design of a Fast and Low-Power Sense Amplifier and Writing Circuit for High-Speed MRAM", IEEE Transactions on Magnetics, May 23, 2015, vol. 51, No. 5, 7 pgs.
Lee et al., "Low-Power, High-Density Spintronic Programmable Logic with Voltage-Gated Spin Hall Effect in Magnetic Tunnel Junctions", IEEE Magnetics Letters, Mar. 4, 2016, vol. 7, 5 pgs.
Lee et al., "Source Line Sensing in Magneto-Electric Random-Access Memory to Reduce Read Disturbance and Improve Sensing Margin", IEEE Magnetics Letter, Apr. 7, 2016, vol. 7, 5 pgs.
Li, L. et al., "Black phosphorus field-effect transistors", Nature Nanotechnology, May 16, 2014, vol. 9, pp. 372-377.
Lin, Y.-M. et al., "Wafer-Scale Graphene Integrated Circuit", Science, Jun. 10, 2011. vol. 332, pp. 1294-1297.
Liu, W. et al., "Role of Metal Contacts in Designing High-Performance Monolayer n-Type WSe2 Field Effect Transistors", Nano Letters, Mar. 25, 2013, vol. 13, pp. 1983-1990.
Liu, Leitao et al., "On Monolayer MoS2 Field-Effect Transistors at the Scaling Limit", IEEE Transactions on Electron Devices, vol. 60, No. 12, Mar. 25, 2013, pp. 4133-4139.
Mandelman et al., "Challenges and future directions for the scaling of dynamic random-access Memory (DRAM)", IBM. F. Res & Dev, Mar. 1, 2002, vol. 46, No. 2/3, pp. 187-212.
Meng et al., "Electric field control of spin re-orientation in perpendicular magnetic tunnel junctions—CoFeB and MgO thickness dependence", Applied Physics Letters, Jul. 31, 2014, vol. 105, pp. 042410-1-042410-5.
Miro, P. et al., "An atlas of two-dimensional materials", Chemical Society Reviews, May 14, 2014, vol. 43, pp. 1983-1990.
Novoselov, K. S., "Electric Field Effect in Atomically Thin Carbon Films", Science, Oct. 22, 2004, vol. 306, pp. 666-669.
Ong, P. et al., "Strain-induced Giant Magnetoelectric Effect in Heavy Metal/Magnet/Insulator Junctions", 59th Conference on Magnetism and Magnetic Materials, Honolulu, Hawaii, USA, EE-13 (Sep. 6, 2014), 2 pgs.
Ong et al., "Giant voltage modulation of magnetic anisotropy in strained heavy metal/magnet/insulator heterostructures", Physical Review B 92, 020407(R), Jul. 20, 2015, pp. 020407-1-020407-5.
Otsuka et al., "A 4Mb conductive-Bridge Resistive Memory with 2.3GB/s Read-Throughput and 216MB/s Program-Throughput", 2011 IEEE International Solid-State Circuits Conference, ISSCC2011, Feb. 22, 2011, pp. 210-211.

(56) References Cited

OTHER PUBLICATIONS

Pospischil, A. et al., "Solar-energy conversion and light emission in an atomic monolayer p-n diode", Nature Nanotechnology, published online Mar. 9, 2014, vol. 9, pp. 257-261.

Radisavljevic, B. et al., "Single-Layer MoS2 Transistors", Nature Nanotechnology, published online Jan. 30, 2011, vol. 6, pp. 147-150.

Rippard et al., "Thermal relaxation rates of magnetic nanoparticles in the presence of magnetic fields and spin-transfer effects", Physical Review B, Aug. 29, 2011, pp. 064439-1-064439-7.

Roy, T. et al., "Field-Effect Transistors Built from All Two-Dimensional Material Components", ACSNano, published online Apr. 28, 2014, vol. 8, No. 6, pp. 6259-6264.

Shamsi et al., "Reliable and High Performance STT-MRAM Architectures Based on Controllable-Polarity Devices", IEEE International Conference on Computer Design (ICCD), Oct. 1, 2015, pp. 343-350.

Shiota, Y. et al., "Induction of coherent magnetization switching in a few atomic layers of FeCo using voltage pulses", Nature Materials, published online Nov. 13, 2011, vol. 11, pp. 39-43.

Shiota et al., "Pulse voltage-induced dynamic magnetization switching in magnetic tunneling junctions with high resistance-area product", Applied Physics Letters, Sep. 5, 2012, vol. 101, pp. 102406-1-102406-4.

Song et al., "Bidirectional Two-Terminal Switching Device for Crossbar Array Architecture", IEEE Electron Device Letters, Jul. 27, 2011, vol. 32, No. 8, pp. 1023-1025.

Tian, H. et al., "Novel Field-Effect Schottky Barrier Transistors Based on Graphene-MoS2 Heterojunctions", Scientific Reports, Aug. 11, 2014, vol. 4, 9 pgs.

Tsuchida et al., "A 64Mb MRAM with Clamped-Reference and Adequate-Reference Schemes", 2010 IEEE International Solid-State Circuits Conference, ISSCC 2010/Session 14/ Non-Volatile Memory, Mar. 11, 2010, pp. 258-260.

Wang, H. et al., "Integrated Circuits Based on Bilayer MoS2 Transistors", Nano Letters, Aug. 3, 2012, vol. 12, pp. 4674-4680.

Wang, Q. H., "Electronics and optoelectronics of two-dimensional transition metal dichalcogenides", Nature Nanotechnology, published online Nov. 6, 2012, vol. 7, pp. 699-712.

Wang, X. et al., "Chemical Vapor Deposition Growth of Crystalline Monolayer MoSe2", ACS Nano, published online Mar. 29, 2014, vol. 8, No. 5, pp. 5125-5131.

Wang et al., "Comparative Evaluation of Spin-Transfer-Torque and Magnetoelectric Random Access Memory", IEEE Journal on Emerging and Selected Topics in Circuits and Systems, Jun. 9, 2016, vol. 6, No. 2, pp. 134-145.

Wang et al., "Design and Implementation of dynamic Word-Line Pulse Write", IEEE, May 29, 2012, pp. 116-119.

Wang et al., "Electric-field-assisted switching in magnetic tunnel junctions", Nature Materials, published online Nov. 13, 2011, vol. 11, pp. 64-68.

Wang et al., "Low-power non-volatile spintronic memory: STT-RAM and beyond", J. Phys. D: Appl. Phys., Jan. 31, 2013, vol. 46, 10 pgs.

Wang et al., "Magnetoelectric Random Access Memory-Based Circuit Design by Using Voltage-Controlled Magnetic Anisotrophy in Magnetic Tunnel Junctions", IEEE Transactions on Nanotechnology, Nov. 6, 2015, vol. 14, No. 6, pp. 992-997.

Worledge et al., "spin torque switching of perpendicular Ta | CoFeB | MgO-based magnetic tunnel junctions", Applied Physics Letters, Jan. 8, 2011, vol. 98, pp. 022501-1-022501-3.

Yoshimoto et al., "A 40-nm 8T SRAM with Selective Source Line Control of Read Bitlines and Address Preset Structure", Published in: Custom Integrated Circuits Conference (CICC), Sep. 22, 2013 IEEE, 4 pgs.

Yu et al., "Highly efficient gate-tunable photocurrent generation in vertical heterostructures of layered materials", Nature Nanotechnology, published online Oct. 27, 2013, vol. 8, pp. 952-958.

Yu et al., "Vertically stacked multi-heterostructures of layered materials for logic transistors and complementary inverters", Nature Materials, published online Dec. 16, 2012, Mar. 2013, vol. 12, pp. 246-252.

Zhan, Y. et al., "Large-Area Vapor-Phase Growth and Characterization of MoS2 Atomic Layers on a SiO2 Substrate", Small, Feb. 15, 2012, vol. 8, No. 7, pp. 966-971.

Zhang, Y. et al., "Controlled Growth of High-Quality Monolayer WS2 Layers on Sapphire and Imagine Its Grain Boundary", ACSNano, published online Sep. 18, 2013, vol. 7, No. 10, pp. 8963-8971.

Emori et al., "Large voltage-induced modification of spin-orbit torques in Pt/Co/GdOx", Appl. Phys. Lett. 105, 222401 (2014).

Newhouse-Illige et al., "Voltage-controlled interlayer coupling in perpendicularly magnetized magnetic tunnel junctions", Nat. Commun. 8, 15232 doi: 10.1038/ncomms15232, Published May 16, 2017.

* cited by examiner

SYSTEMS FOR IMPLEMENTING WORD LINE PULSE TECHNIQUES IN MAGNETOELECTRIC JUNCTIONS

CROSS-REFERENCE TO RELATED APPLICATIONS

The current application claims priority to U.S. Provisional Application No. 62/355,710, filed Jun. 28, 2016, the disclosure of which is incorporated herein by reference.

FIELD OF THE INVENTION

The present invention generally relates to electronic circuits and more specifically to the implementation of magnetoelectric junctions.

BACKGROUND OF THE INVENTION

Devices that rely on electricity and magnetism underlie much of modern electronics. Particularly, researchers have begun to develop and implement devices that take advantage of both electricity and magnetism in spin-electronic (or so-called "spintronic") devices. These devices utilize quantum-mechanical magnetoresistance effects, such as giant magnetoresistance (GMR) and tunnel magnetoresistance (TMR). GMR and TMR principles regard how the resistance of a thin film structure that includes alternating layers of ferromagnetic and non-magnetic layers depends upon whether the magnetizations of ferromagnetic layers are in a parallel or antiparallel alignment. For example, magnetoresistive random-access memory (MRAM) is a technology that is being developed that typically utilizes TMR phenomena in providing for alternative random-access memory (RAM) devices. In a typical MRAM bit, data is stored in a magnetic structure that includes two ferromagnetic layers separated by an insulating layer—this structure is conventionally referred to as a magnetic tunnel junction (MTJ). The magnetization of one of the ferromagnetic layers (the fixed layer) is permanently set to a particular direction, while the other ferromagnetic layer (the free layer) can have its magnetization direction free to change. Generally, the MRAM bit can be written by manipulating the magnetization of the free layer such that it is either parallel or antiparallel with the magnetization of the fixed layer; and the bit can be read by measuring its resistance (since the resistance of the bit will depend on whether the magnetizations are in a parallel or antiparallel alignment).

SUMMARY OF THE INVENTION

Systems and methods for performing word line pulse techniques in magnetoelectric junctions in accordance with embodiments of the invention are disclosed. In one embodiment, a magnetoelectric random access memory circuit, including, a plurality of voltage controlled magnetic tunnel junction bits each magnetoelectric junction includes at least one free magnetic layer, one fixed magnetic layer, and one dielectric interposed between the two magnetic layers, application of a voltage with a given polarity to the magnetoelectric junction reduces the perpendicular magnetic anisotropy and the magnetic coercivity of the free layer through the voltage controlled magnetic anisotropy (VCMA) effect, application of a voltage with opposite polarity increases the perpendicular magnetic anisotropy and magnetic coercivity of the free layer through the VCMA effect, each magnetoelectric junction is connected to the drain of an MOS transistor, the combination including a MeRAM cell, each MeRAM cell includes three terminals, each connected respectively to a bit line, a source line, and at least one word line, in an array, and a driver circuit, including a bit line driver, and a word line driver a pulse generator can trigger the word line driver, each bit line driver and word line driver is controlled by complimentary signals, the bit line driver includes a plurality of pull-up circuits, and the word line driver consists of a n-channel MOS transistor and a p-channel MOS transistor, each of the plurality of pull-down circuits of the bit line driver and the word line driver also consist of two n-channel MOS transistors, and the driver circuit generates voltage pulses for application to the magnetoelectric junction bit, the output of the driver circuit is connected to the word line, which in turn is connected to the gate of the MOS access transistor in each MeRAM cell, thereby generating a square voltage pulse across the magnetoelectric junction bit.

In a further embodiment, the magnetoelectric junction bit free layer includes a combination of Co, Fe and B.

In another embodiment, the magnetoelectric junction bit dielectric barrier includes MgO.

In a still further embodiment, the magnetoelectric junction bit free layer is placed adjacent to a metal layer, including one or a combination of the elements Ta, Ru, Mn, Pt, Mo, Ir, Hf, W, and Bi.

In still another embodiment, the free layer magnetization changes direction in response to a voltage pulse across the magnetoelectric junction bit, which is timed to approximately half the ferromagnetic resonance period of the free layer.

In a yet further embodiment, the free layer magnetization has two stable states which are perpendicular to plane in the absence of voltage.

In yet another embodiment, the free layer magnetization has two stable states which are in plane in the absence of voltage.

In a further embodiment again, the magnetoelectric junction bit has a circular shape.

In another embodiment again, the magnetoelectric junction bit has an elliptical shape.

In a further additional embodiment, the driver circuit includes the bit line driver, word line driver, and pulse generator.

In another additional embodiment, the bit line driver has the pull-up circuit, including an n-channel MOS transistor and a p-channel MOS transistor, and the pull-down circuit, including two n-channel transistors.

In a still yet further embodiment, the word line driver has the pull-up circuit, including an n-channel MOS transistor and a p-channel MOS transistor, and the pull-down circuit, including two n-channel transistors.

In still yet another embodiment, the bit line driver is controlled by complementary signals.

In a still further embodiment again, the word line driver is controlled by complementary signals, which are created by the pulse generator.

In still another embodiment again, the pulse generator creates complementary signals whose width are adjustable via a digital code.

In a still further additional embodiment, the output of the bit line driver is connected to the bit line.

In still another additional embodiment, the output of the word line driver is connected to the word line.

Other objects, advantages and novel features, and further scope of applicability of the present invention will be set forth in part in the detailed description to follow, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The description will be more fully understood with reference to the following figures, which are presented as exemplary embodiments of the invention and should not be construed as a complete recitation of the scope of the invention, wherein.

DETAILED DESCRIPTION

Figure 1:
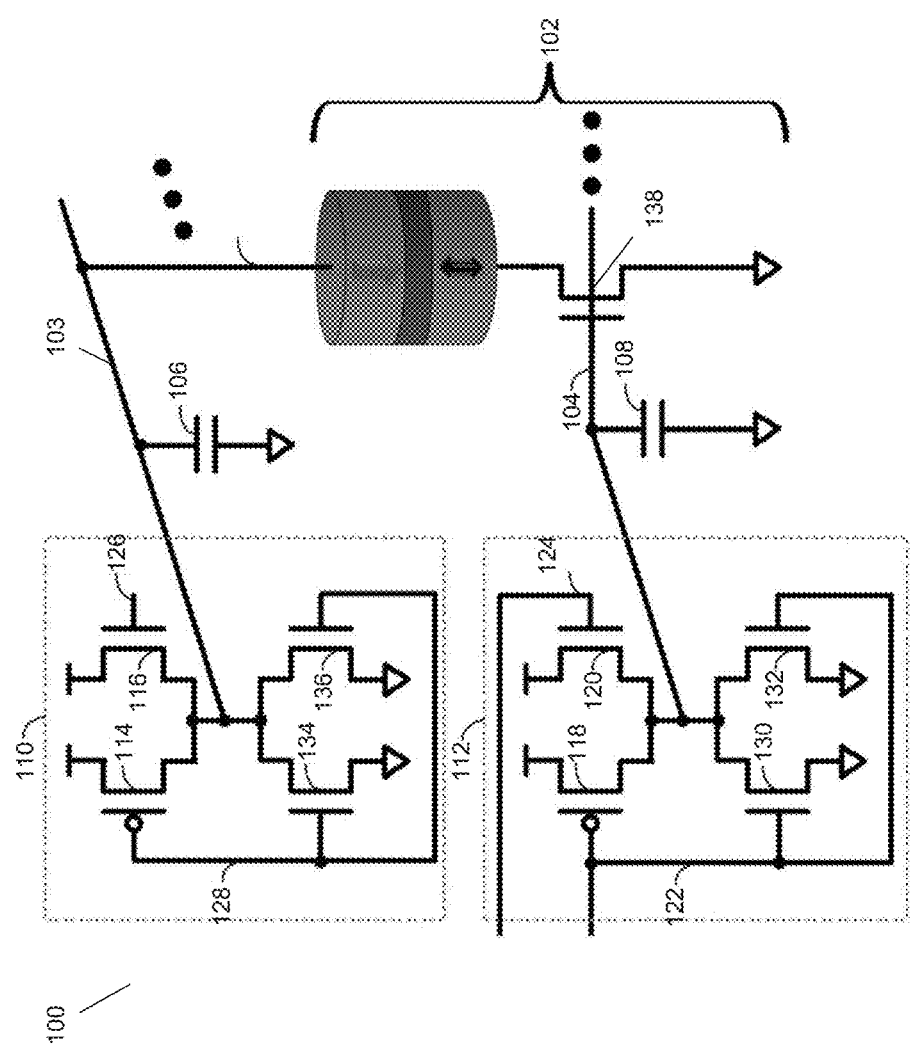
FIG. 1 conceptually illustrates a word line pulse MeRAM system in accordance with certain embodiments of the invention.

Turning now to the drawings, systems and methods for implementing word line pulse techniques in magnetoelectric junctions are illustrated. In the field of random-access memory, bits of data are written to memory cells for storage. The current application describes a scheme for writing these bits of data to memory cells through the word line instead of the bit line as in traditional applications. The word line pulse techniques described in accordance with embodiments of the invention improve the write error rate and cell area efficiency by writing utilizing better shaped square pulses for writing. These improvements allow for the use of magnetoelectric random-access memories (MeRAM) in an increased number of applications.

Some challenges currently prevent MeRAM from being implemented in certain applications including embedded system memory applications. One current problem with utilizing magnetoelectric junctions in certain memory applications is a relatively high write error rate (WER). Write errors are typically caused by applying a degraded write pulse (e.g. shape and duration). A high WER severely limits applications in high speed memories. This is due to the fact that high a WER (i.e. 1 error per roughly $10^{-3}$ writes) requires multiple write operations to achieve an acceptable bit error rate (BER) (i.e. 1 error per roughly $10^{-9}$ bits). Hence, the total write access time could become too long to meet the speed requirements of high speed applications.

The word line pulse system in accordance with embodiments of the invention improves the WER by generating a better square shape write pulse. For numerous embodiments, magnetoelectric junctions that take advantage of voltage controlled magnetic anisotropy (VCMA) effects, the write pulse can have a tremendous impact on the switching probability. A square shape pulse typically results in a much higher switching probability compared to that of a triangular shape pulse.

Compared to a conventional bit line pulse (BLP) scheme, there are several reasons why the WLP system can generate a better square shape pulse in accordance with embodiments of the invention: WLP can reduce discharge paths under the pulse condition, WLP can also exploit the gain of the access transistor, and WLP can effectively diminishes capacitive loading. In certain embodiments, WLP schemes can improve WER by a factor of $10^7$ and allows MeRAM to have a four times improvement in area efficiency of driver circuits compared to BLP methods.

Word line pulse systems on a typical MeRAM chip in accordance with embodiments of the invention are applied over a plurality of cell grids or groupings of cells. These cells are typically made up of memory cells. Numerous applications have used magnetic tunnel junctions (MTJs) as memory cells in magnetoresistive random-access memory (MRAM). However, the magnetoelectric tunnel junction (MEJ) is an emerging variant of the MTJ device used in MRAM, which exploits magneto-electric interface effects to control its free layer magnetization, and tunneling magnetoresistance (TMR) to read its state. Generally, the coercivity of the free layer of a mej can be reduced using VCMA phenomena, thereby making the free layer more easily switched to the opposite direction ('writeable'). It has been demonstrated that such devices employing VCMA principles result in marked performance improvements over conventional MTJs. The electric-field-controlled nano-magnets used in MEJs are being developed as basic building blocks for the next generation of memory and logic applications, since they have the potential for significant reductions in power dissipation, offer high endurance and density, and can be applied to high-speed operation systems.

The MEJ can differ from a conventional magnetic tunnel junction in that an electric field is used to induce switching, in lieu of substantial current flow for utilizing spin transfer torque (STT) in a current-controlled MTJ. Compared to MTJs, MEJs have at least three noticeable advantages: i) extremely low dynamic switching energy due to significant reduction of Ohmic loss, ii) sub-nanosecond writing speed based on precessional switching (which for STT devices requires very large currents through the device to achieve the same speed), iii) high density in a memory array application due to the use of minimum sized access transistors or diodes in a cell.

Word line pulse systems can utilize a number of MEJ variants depending on the specific application required. In broad terms, a fundamental MEJ structure includes a ferromagnetic (FM) fixed layer, a FM free layer that has a uniaxial anisotropy, and a dielectric layer separating the FM fixed layer and FM free layer. For simplicity, it should be noted that the terms "FM fixed layer" and "fixed layer" will be considered equivalent throughout this application, unless otherwise stated; similarly, the terms "FM free layer", "ferromagnetic free layer," "free layer that has a uniaxial anisotropy", and "free layer" will also be considered equivalent throughout this application, unless otherwise stated.

Generally, the FM fixed layer in accordance with many embodiments of the invention may have a fixed magnetization direction, i.e. the direction of magnetization of the FM fixed layer does not typically change during the normal operation of the MEJ. Conversely, in certain embodiments, the FM free layer can adopt a magnetization direction that is either substantially parallel with or antiparallel with the FM fixed layer, i.e. during the normal operation of the MEJ, the direction of magnetization can be made to change. For example, the FM free layer may have a magnetic uniaxial anisotropy, whereby it has an "easy axis" that is substantially aligned with the direction of magnetization of the FM fixed layer. The "easy axis" refers to the axis, along which the magnetization direction of the layer prefers to align. In other words, an easy axis is an energetically favorable direction (axis) of spontaneous magnetization that is determined by various sources of magnetic anisotropy including, but not limited to, magnetocrystalline anisotropy, magnetoelastic anisotropy, geometric shape of the layer, etc. Relatedly, an "easy plane" is a plane whereby the direction of magnetization is favored to be within the plane, although there is no bias toward a particular axis within the plane.

Typically, VCMA phenomena can be relied on in switching the FM free layer's characteristic magnetization direction, i.e. the MEJ can be configured such that the application of a potential difference across the MEJ can reduce the coercivity of the free layer, which can allow the free layer's magnetization direction to be switched more easily. In other words, with a reduced coercivity, the FM free layer can be subject to magnetization that can make it substantially parallel with or substantially antiparallel with the direction of the magnetization for the FM fixed layer.

While MEJs demonstrate much promise in use as memory cells in word line pulse systems, their potential applications and variations continue to be explored. For example, U.S. Pat. No. 8,841,739 (the '739 patent) to Khalili Amiri et al. discloses DIOMEJ cells that utilize diodes (e.g. as opposed to transistors) as access devices to MEJs. As discussed in the '739 patent, using diodes as access devices for MEJs can confer a number of advantages and thereby make the implementation of MEJs much more practicable. The disclosure of the '739 patent is hereby incorporated by reference in its entirety, especially as it pertains to implementing diodes as access devices for MEJs. Furthermore, U.S. patent application Ser. No. 14/073,671 ("the '671 patent application") to Khalili Amiri et al. discloses MEJ configurations that demonstrate improved writeability and readability, and further make the implementation of MEJs more practicable. The disclosure of the '671 patent application is hereby incorporated by reference in its entirety, especially as it pertains to MEJ configurations that demonstrate improved writeability and readability. A conceptual illustration of a word line pulse system is discussed in the following section.

Word Line Pulse MeRAM Systems

Word line pulse MeRAM systems in accordance with embodiments of the invention can store data with a reduced WER by creating a better shaped square pulse and improved cell area efficiency by utilizing word line drivers.

Generally, MeRAM systems traditionally apply a square shaped pulse as a write pulse over the bit line of the system. Instead of applying a write pulse to the bit line as in traditional BLP schemes, MeRAM systems in accordance with embodiments of the invention apply a write pulse to the word line, creating a world line pulse (WLP). The WLP can create a better square shaped pulse across the MEJ, which in turn improves switching probability, and minimizes the area overhead (e.g., driver size). Additionally, for the voltage controlled magnetic anisotropy (VCMA) induced precessional switching of the MEJ, the write pulse has a tremendous impact on the switching probability as a square shaped pulse causes a stable precessional trajectory of the free layer magnetization by providing a relatively constant in-plane dominant effective field.

Traditionally, the simplest way to improve the write pulse shape is to increase the size of the transistor in the drivers associated with the loadings on the bit line or word line. However, the increase in driver size might limit the memory capacity in a given die area, resulting in low cell area efficiency. The cell area efficiency is typically used as a target parameter to compare the compactness of memory designs. A reduction in the driver size may improve the cell area efficiency. Word line pulse systems in accordance with embodiments of the invention allow for the reducing of the driver size while generating a sufficient square shape pulse. In several embodiments, this is achieved due to the fact that word line drivers are utilized which are smaller than the traditionally used bit line drivers.

A conceptual diagram of a word line pulse MeRAM system in accordance with an embodiment of the invention is shown in FIG. 1. The word line pulse MeRAM system 100 contains a MeRAM cell 102. In many embodiments, the word line pulse MeRAM system 100 has a plurality of MeRAM cells 102 connected in a series within a memory element. The MeRAM cell 102 contains a MEJ and an access transistor 138. The access transistor 138 is connected to a word line 104 that is itself connected to a word line capacitor ($C_{WL}$) 108 and word line driver (WLD) 112. In several embodiments, the number of access transistors 138 connecting the word line 104 and the relative length of the word line 104 determine the capacitive loading of the line capacitor 108. In a number of embodiments, the word line driver 112 is itself is composed of a driver word line input (DWL) 124 that receives a voltage from a pulse generator to enable the word line driver 112. In certain embodiments, the word line driver 112 can also contain a complementary driver word line input signal ($\overline{DWL}$) 122. The word line driver 112 contains a n-channel transistor 120 in the pull-up path of the word line driver 112 and connected to the word line 104. In still additional embodiments, a p-channel transistor 118 also in the pull-up path can work simultaneously with the pull-up n-channel transistor 120 to pull up the word line 104. In various embodiments, the word line driver 112 is connected to the complementary driver word line input signal 122 and the word line 104. In still yet additional embodiments, a pair of pull-down n-channel transistors 130 and 132 are part of the word driver 112 and connected to the complementary driver word line input signal 122 and the word line 104.

Similarly, in additional embodiments, a bit line driver 110 is constructed in a similar manner compared to the word line driver 112. In a number of embodiments, a driver bit line input signal (DBL) 126 provides a pulse that can enable the bit driver 110. The driver bit line signal 126 is connected to a n-channel pull-up transistor 116 and has a complementary driver bit line input signal ($\overline{DBL}$) 128 which is itself connected to a pull-up p-channel transistor 114 and two pull-down n-channel transistors 134, 136. Each of the pull-down transistors 134, 136 and the pull-up n-channel transistor 116 and pull-up p-channel transistor 114 are connected to the bit line. The bit line itself is connected to the MeRAM cell 102 and a bit line capacitor ($C_{BL}$) 106.

In certain embodiments, the capacitive and resistive loading on the bit line (BL) 103 and word line (WL) 104 can be different, leading to differing sizes of bit line drivers 110 and word line drivers 112 because of the varying structures or requirements of the application. Examples of some of these variables include, but are not limited to, the physical length of the bit line 103 and word line 104, and/or the parasitic components of the actual design. By way of example, the bit line 103 loading may include metal parasitic RC, the MEJ's capacitance, and the access transistor's junction capacitance. Conversely, the word line loading may consist of the metal parasitic RC (of the other metal layer) and the gate capacitance of the access transistors 138. In several embodiments, the bit line drivers 110 and word line driver 112 sizes can be determined via circuit simulations.

Additionally, the size of the bit line driver 110 and word line driver 112 in accordance with embodiments of the invention may be determined based on timing constraints. In MeRAM, the write operation's pulse shape (slew rate, width, and amplitude) is a critical factor in determining overall performance. In conventional bit line pulse (BLP) schemes, the drivability of the bit line driver 110 should be able to meet the write timing requirement for the bit line 103 by adjusting the driver size. However, in certain embodiments, since the timing constraint for the word line is relatively loose, the size of the word line driver 112 can be smaller than that of the bit line driver 110, increasing cell area efficiency. The exact size of both the bit line driver 110 and the word line driver 112 should be determined as needed based on the timing requirements of the application.

Although specific conceptual embodiments are described above regarding word line pulse MeRAM systems with respect to FIG. 1, any of a number of word line pulse MeRAM systems in a system can be utilized as appropriate to the requirements of specific applications in accordance with various embodiments of the invention. A discussion about the control signals representing a write pulse of a word line pulse MeRAM system is covered in the following section.

Word Line Pulse MeRAM System Control Signals

Word line pulse MeRAM system control signals in accordance with embodiments of the invention can indicate how a typical write operation can produce a better square wave signal. Instead of applying a write pulse to the bit line as in traditional BLP schemes, MeRAM systems in accordance with embodiments of the invention apply a write pulse to the word line and produce a better square wave signal across a MEJ via the potential difference between the bit line and the access transistor drain (DR) 250, 255.

Figure 2:
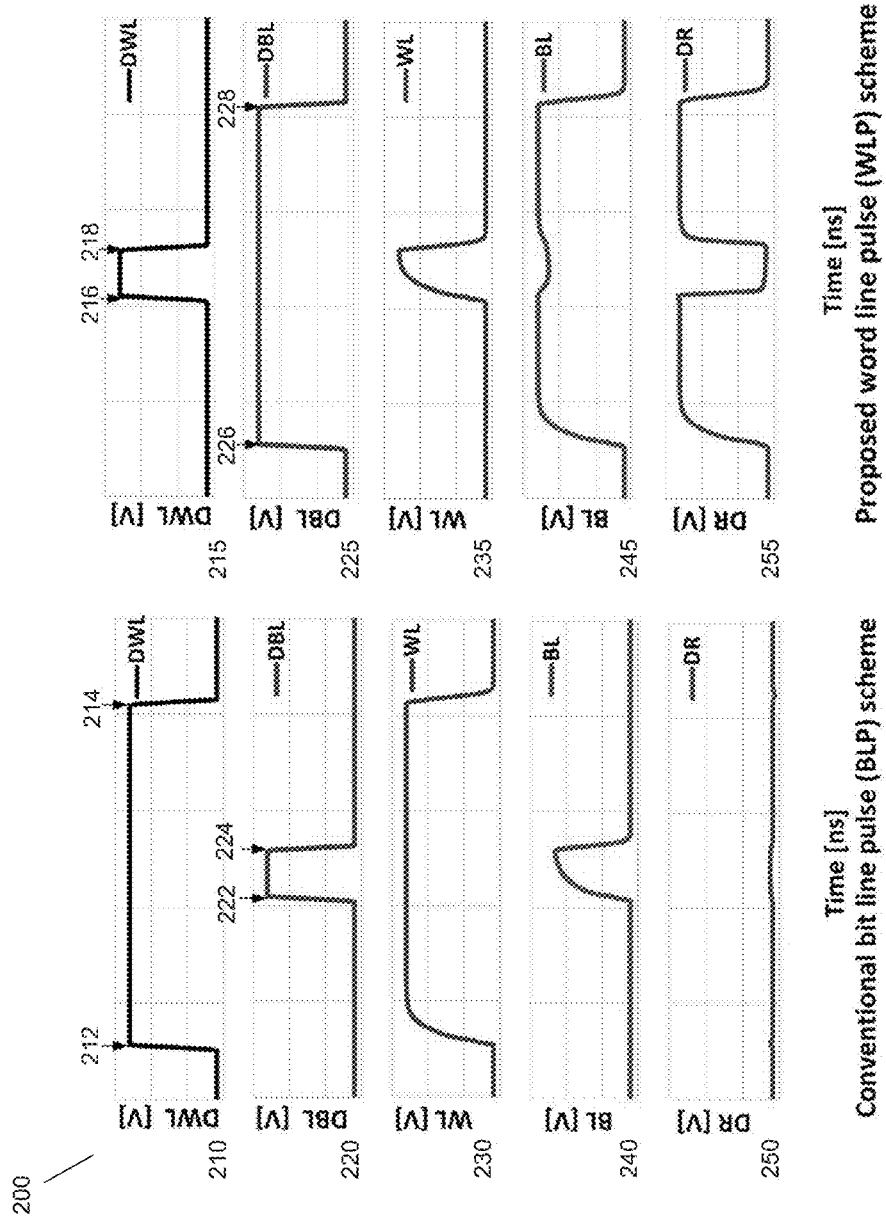
FIG. 2 conceptually illustrates bit line pulse and word line pulse control signals in accordance with certain embodiments of the invention.

A conceptual diagram of word line pulse MeRAM system control signals 200 in accordance with an embodiment of the invention is shown in FIG. 2. The conventional control signals of a bit line pulse scheme are shown on the left side of FIG. 2 while a word line pulse scheme control signal set is shown on the right side of FIG. 2. Each scheme has five signals that are graphed to represent voltage over time, and each signal corresponds to a physical aspect of the word line pulse MeRAM system. The signals include the driver word line signal (DWL) 210, 215, the driver bit line signal (DBL) 220, 225, the word line (WL) 230, 235, the bit line (BL) 240, 245 and the drain of the access transistor of the MeRAM cell (DR) 250, 255. In many embodiments, the rising and falling time that signals need to change may be roughly 100 ps.

In the traditional BLP write mode scheme, the WL driver is enabled by DWL 210 first at a time equal to 212. This charges up the selected WL to Voltage drain-to-drain ($V_{DD}$), which then turns on the access transistor. Then, the DBL 220 triggers the BL driver that starts to charge up the BL 240 at time equal to 222. However, in further embodiments, this BLP scheme deforms the write pulse shape because the BL driver directly drives the entire BL capacitance loading $C_{BL}$, and some portion of the entire electric charge leaks through the unselected MeRAM cells, which prohibits the BL 240 from reaching its $V_{DD}$ within a within a 1 ns period and increases the rising time of the write pulse. Additionally, as the capacitive loading increases, the write pulse is severely degraded, until it eventually fails to switch the MEJ since the pulse becomes more triangular shaped and the amplitude diminishes. In certain embodiments, the failure to switch can occur when the capacitive load of the bit line capacitor $C_{BL}$ reaches 30 fF.

By contrast, in a WLP write mode system, the waves of the control signals are shown in the right side of FIG. 2. In several embodiments, the DBL 225 enables the charging of the bit line 245 at time 226 to $V_{DD}$. This also charges the DR 255 of the access transistor to $V_{DD}$ since the access transistor turns off at time 226. Then, in several additional embodiments, the DWL 215 is enabled and starts to increase the WL 235 potential at time 216. In many embodiments, the slew rate of the WL 235 is improved by roughly 20% compared to that of the BLP method since the gate of the access transistor provides a high input resistance, eliminating a discharge path. Furthermore, the WLP system can efficiently utilize the current gain of the access transistor through a common-source stage. Even below the threshold of the access transistor, the current flowing through the access transistor exponentially increases as a function of the WL 235 voltage. Above the threshold, the provided current increases quadratically as the WL 235 voltage increases further. It should be noted that in various embodiments, the time between when a DWL pulse rises (216) and falls (218) is roughly one-half of the precession of the mangnetization of the free layer. In still numerous embodiments, the time between the rise of the DBL signal (222) is followed by a drop (224) that also corresponds to one-half of the precession of the magnetization of the free layer. Ultimately, in a number of embodiments, the WL 235 voltage rapidly discharges the drain 255 node to ground via the access transistor at time 216, since the capacitance loading on the drain 255 node consists only of a MEJ and the access transistor itself, which is significantly smaller than the bit line capacitor $C_{BL}$. The DBL 225 voltage then drops at 228 disenabling the BL 245 and DR 255. The voltage across the MEJ can be measured as the potential difference between the bit line and the drain nodes. In a large number of embodiments, the word line pulse system can create a wider and better defined square shape pulse across the MEJ via the DR 255, allowing the circuit to achieve more reliable write operations. Additionally, unlike the capacitive load issues of the BLP scheme, in WLP systems in accordance with embodiments of the invention, a square shape can be generated regardless of the capacitive loading involved (within normal operating parameters).

Although specific conceptual illustrations are described above regarding word line pulse MeRAM control signals with respect to FIG. 2, any of a number of word line pulse MeRAM control signals in a system can be utilized as appropriate to the requirements of specific applications in accordance with various embodiments of the invention. MeRAM cells suitable for world line pulse systems are discussed in the following section.

Word Line Pulse MeRAM Cells

Word line pulse MeRAM systems in accordance with embodiments of the invention utilize a series of MeRAM cells to store bits of data. The MeRAM cells contain a combination of MEJ cell and an access transistor. The MEJ cells are discussed in more detail in the following sections and can be composed of many different embodiments. In many embodiments, the fixed layer side of the MEJ is connected to the bit line while the free layer is connected to the access transistor.

Figure 3:
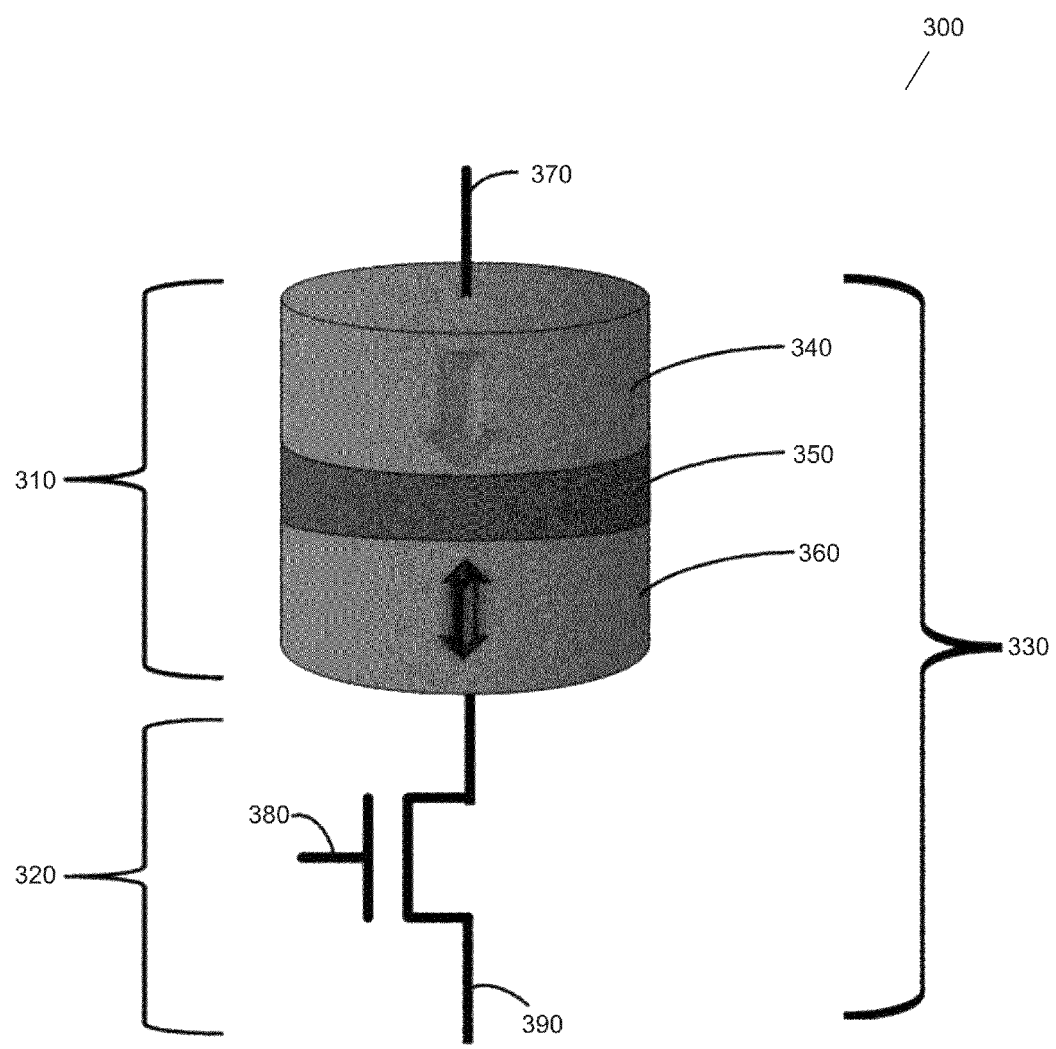
FIG. 3 conceptually illustrates a word line pulse MeRAM cell in accordance with certain embodiments of the invention.

A conceptual illustration of a MeRAM cell in accordance with embodiments of the invention is shown in FIG. 3. In several embodiments, the MeRAM cell 300 primarily consists of a MeRAM storage element 330. In a number of embodiments, the storage element 330 can be understood as being composed of a MEJ portion 310 and an access transistor 320. In certain embodiments, the MEJ 310 includes a fixed layer 340 and a magnetic free layer 360 with a tunnel barrier 350 in between. In further embodiments, the access transistor 320 may include a word line 380 and a source line 390. Additionally, still further embodiments may have a bit line 370 accessing the MEJ portion 310.

Although specific conceptual embodiments are described above regarding word line pulse MeRAM cells with respect to FIG. 3, any of a number of word line pulse MeRAM cells in a system can be utilized as appropriate to the requirements of specific applications in accordance with various embodiments of the invention. A discussion about implementing a plurality of MEJs in a word line pulse MeRAM system is covered in the following section.

Implementing a Plurality of MEJs

Pluralities of MEJs can be implemented in any of a variety of configurations for use in MeRAM cells in accordance with embodiments of the invention. Word line pulse MeRAM systems typically utilize MEJs as the MeRAM memory storage element. These MEJs are often implemented as a plurality of MEJs in a contained system. In certain embodiments, the MEJs in contained systems may be implemented as a series of MeRAM cells in a MeRAM system. For example, the '671 patent application (incorporated by reference above) discloses MEJ configurations that include a second dielectric layer proximate the free layer and configured to enhance the VCMA effect. It should be clear that any suitable MEJ configuration may be incorporated in accordance with embodiments of the invention.

Note that while the subsequent discussions largely regard the operation of single MEJs, it should of course be understood that in many embodiments, a plurality of MEJs are implemented together. For example, the '671 patent application discloses MeRAM configurations that include a plurality of MEJs disposed in a cross-bar architecture. It should be clear that MEJ systems can include a plurality of MEJs in accordance with embodiments of the invention. In several embodiments where multiple MEJs are implemented, they can be separated by field insulation, and encapsulated by top and bottom layers. Thus, for example, FIG. 4 conceptually illustrates the implementation of two MEJs that are housed within encapsulating layers and separated by field insulation. In particular, the MEJs 410 are encapsulated within a bottom layer 420 and a top layer 430. In several embodiments, field insulation 440 is implemented to isolate the MEJs and facilitate their respective operation. It should of course be appreciated that each of the top and bottom layers can include one or multiple layers of materials/structures. As can also be appreciated, the field insulation material can be any suitable material that functions to facilitate the operation of the MEJs in accordance with embodiments of the invention.

Figure 4:
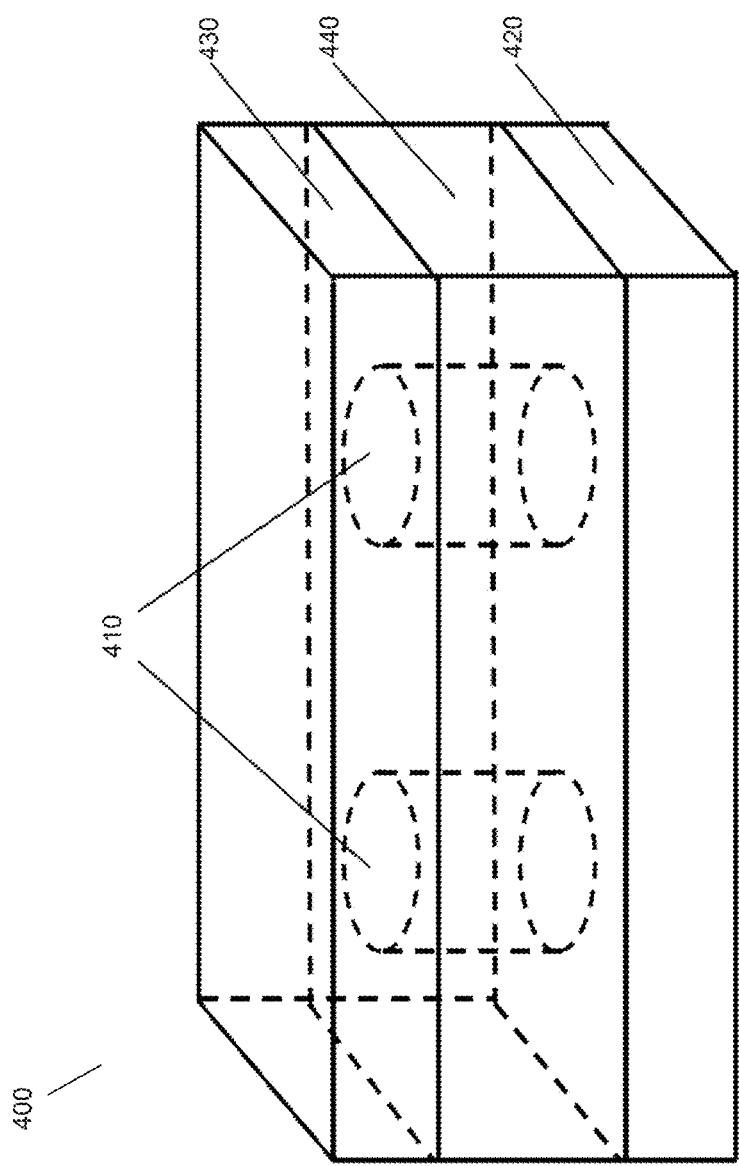
FIG. 4 conceptually illustrates the implementation of a plurality of MEJs in accordance with certain embodiments of the invention.

Although specific conceptual embodiments are described above regarding implementing a plurality of MEJs with respect to FIG. 4, any of a number of methods to implement a plurality of MEJs in a system can be utilized as appropriate to the requirements of specific applications in accordance with various embodiments of the invention. A discussion about the fundamental structure of magnetoelectric junctions is covered in the following section.

Fundamental Magnetoelectric Junction Structures

Magnetoelectric junctions used in Word Line Pulse MeRAM systems can be described conceptually as having a unique structure. As previously discussed, a typical MEJ contains a fixed layer with a magnetic direction that does not change, a free layer that has a magnetic direction that may change, and an insulating layer between the fixed and free layers.

The free layer may have a magnetic uniaxial anisotropy, whereby it has an "easy axis" that is substantially aligned with the direction of magnetization of the fixed layer. The "easy axis" refers to the axis, along which the magnetization direction of the layer prefers to align. In other words, an easy axis is an energetically favorable direction (axis) of spontaneous magnetization. In several embodiments, the free layer having its magnetic direction is parallel to the easy axis, the direction of the magnetization of the fixed layer can be considered to be 'substantially aligned', resulting in an information state that can have a single definition. Likewise, when the free layer has a magnetic direction that is antiparallel with the "easy axis", a second information state can be derived. In a number of embodiments, these two information states can be determined by the difference in resistance of the MEJ in each state.

In many embodiments, the magnetization direction, and the related characteristics of magnetic anisotropy, can be established for the FM fixed and FM free layers using any suitable method. For instance, the shapes of the constituent FM fixed layer, FM free layer, and dielectric layer, can be selected based on desired magnetization direction orientations. For example, in certain embodiments, implementing FM fixed, FM free, and dielectric layers that have an elongated shape, e.g. have an elliptical cross-section, may tend to induce magnetic anisotropy that is in the direction of the length of the elongated axis—i.e. the FM fixed and FM free layers will possess a tendency to adopt a direction of magnetization along the length of the elongated axis. In other words, the direction of the magnetization is 'in-plane'. Alternatively, in several embodiments of the invention, where it is desired that the magnetic anisotropy has a directional component that is perpendicular to the FM fixed and FM free layers (i.e., 'out-of-plane'), the shape of the layers can be made to be symmetrical, e.g. circular, along with the FM layers being made thinner. In this case, while the tendency of the magnetization to remain in-plane may still exist, it may not have a preferred directionality within the plane of the layer. In another several embodiments, because the FM layers are relatively thinner, the anisotropic effects that result from interfaces between the FM layers and any adjacent layers, which tend to be out-of-plane, may tend to dominate the overall anisotropy of the FM layer. Alternatively, a material may be used for the FM fixed or free layers which has a bulk perpendicular anisotropy, i.e. an anisotropy originating from its bulk (volume) rather than from its interfaces with other adjacent layers. In yet many additional embodiments, the FM free or fixed layers may also consist of a number of sub-layers, with the interfacial anisotropy between individual sub-layers giving rise to an effective bulk anisotropy to the material as a whole. Additionally, in numerous embodiments, FM free or fixed layers may be constructed which combine these effects, and for example have both interfacial and bulk contributions to perpendicular anisotropy.

Figure 5:
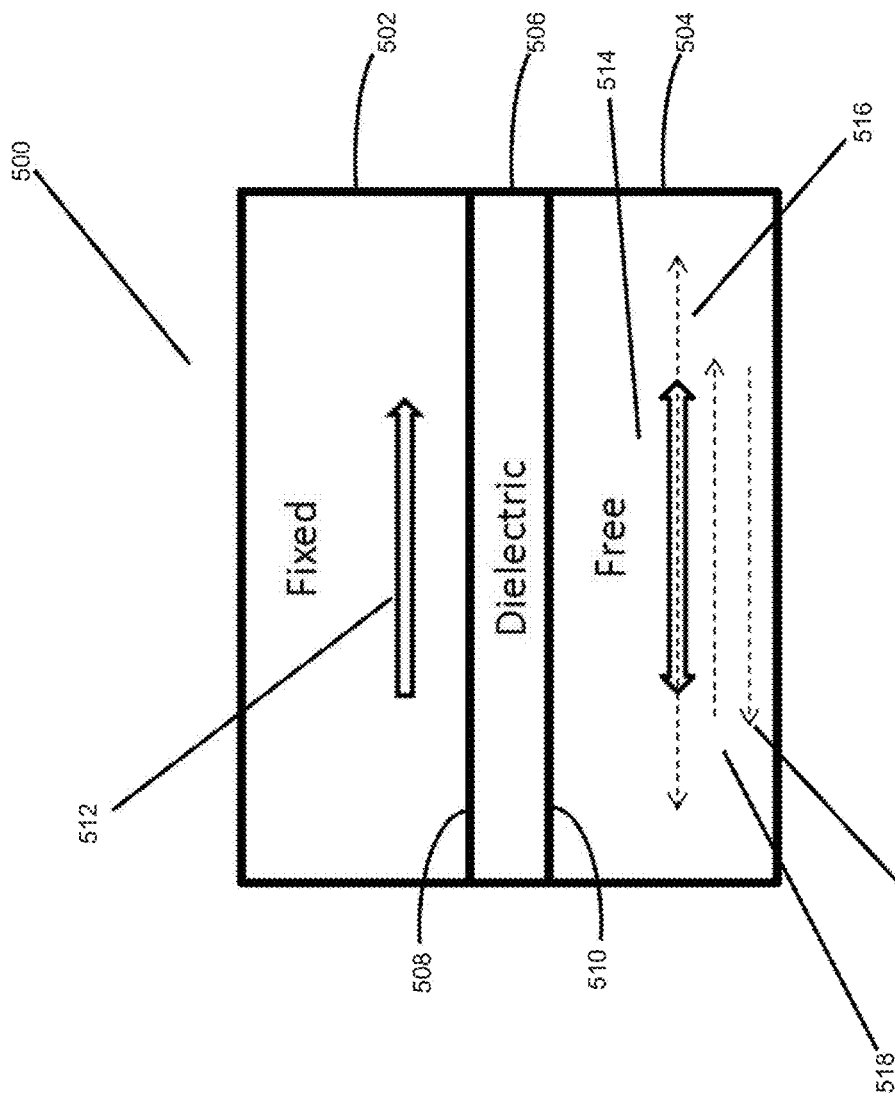
FIG. 5 conceptually illustrates a MEJ that includes in-plane magnetization in accordance with certain embodiments of the invention.

FIG. 5 conceptually illustrates a MEJ whereby a FM fixed layer and a FM free layer are separated by, and directly adjoined to, a dielectric layer. In particular, in accordance with many embodiments of the invention, the MEJ 500 can include a FM fixed layer 502 that can be adjoined to a dielectric layer 506, thereby forming a first interface 508; the MEJ can further include a FM free layer 504 that may be adjoined to a dielectric layer 506 on an opposing side of the first interface 508, thereby forming a second interface 510. In many embodiments, the MEJ 500 may have a FM fixed layer 502 that has a magnetization direction 512 that is in-plane, and depicted in this particular illustration as being from left to right. Accordingly, the FM free layer can be configured such that it can adopt a magnetization direction 514 that is either parallel with or antiparallel with the magnetization direction of the FM fixed layer. For reference, the easy axis 516 is illustrated, as well as a parallel magnetization direction 518, and an antiparallel magnetization direction 520. In several embodiments, additional contacts (capping or seed materials, or multilayers of materials, not shown) may be attached to the FM free layer 504 and the FM fixed layer 502, thereby forming additional interfaces. The contacts may both contribute to the electrical and magnetic characteristics of the device by providing additional interfaces, and can also be used to apply a potential difference across the device. Additionally, it should of course be understood that MEJs can include metallic contacts that can allow them to interconnect with other electrical components.

In many embodiments, by appropriately selecting adjacent materials, the MEJ can be configured such that the application of a potential difference across the FM fixed layer and the FM free layer can modify the magnetic anisotropy of the FM free layer. For example, whereas in FIG. 5, the magnetization direction of the FM free layer is depicted as being in-plane, the application of a voltage may distort the magnetization direction of the FM free layer such that it includes a component that is at least partially out of plane. The particular dynamics of the modification of the magnetic anisotropy will be discussed below in the section entitled "General Principles of MEJ Operation." In a number of embodiments, suitable materials for the FM layers such that this effect can be implemented include, but are not limited to, iron, nickel, manganese, cobalt, FeCoB, FeGaB, FePd, and FePt, CoFe, FeB, NiB, and NiFeB. Further, any compounds or alloys that include these materials may also be suitable. In several embodiments, suitable materials for the dielectric layer include MgO and $Al_2O_3$. Of course, it should be understood that the material selection is not limited to those recited—any suitable FM material can be used for the FM fixed and free layers, and any suitable material can be used for the dielectric layer. It should also be understood that each of the FM free layer, FM fixed layer, and dielectric layer may consist of a number of sub-layers, which acting together provide the functionality of the respective layer.

Figure 6:
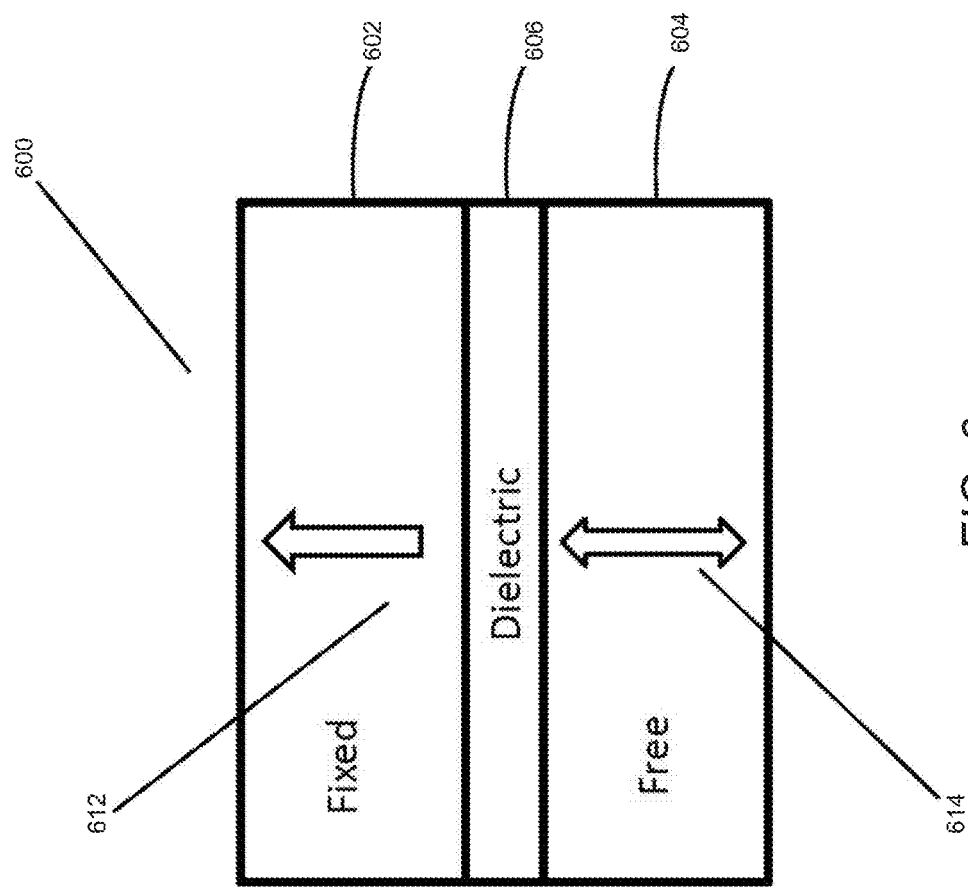
FIG. 6 conceptually illustrates a MEJ that includes out of plane magnetization in accordance with certain embodiments of the invention.

FIG. 6 conceptually illustrates a MEJ whereby the orientation of the magnetization directions can be perpendicular to the plane of the constituent layers. In particular, the MEJ 600 can be similarly configured to that seen in FIG. 5, including a FM fixed layer 602 and an FM free layer 604 adjoined to a dielectric layer 606. However, unlike the MEJ in FIG. 5, the magnetization directions of the FM fixed and FM free layers, 612 and 614 respectively, are oriented perpendicularly to the layers of the MEJ. In several embodiments, additional contacts (capping or seed materials, or multilayers of materials, not shown) may be attached to the FM free layer 604 and the FM fixed layer 602, thereby forming additional interfaces. In additional embodiments, the contacts both contribute to the electrical and magnetic characteristics of the device by providing additional interfaces, and can also be used to apply a potential difference across the device. It should also be understood that each of the FM free layer, FM fixed layer, and dielectric layer may consist of a number of sub-layers, which acting together can provide the functionality of the respective layer.

Although specific conceptual illustrations are described above for both in-plane and out-of-plane MEJ structures with reference to FIGS. 5-6, any of a variety of direction of magnetization for the FM layers can be utilized as appropriate to the requirements of specific applications in accordance with various embodiments of the invention. A discussion on the possibility of multiple layers in a MEJ in accordance with several embodiments of the invention is discussed further below.

Adjunct Layers to Facilitate MEJ Operation

In many embodiments, a mej includes additional adjunct layers that function to facilitate the operation of the MEJ. For example, in certain embodiments, the FM free layer includes a capping or seed layer, which can (1) help induce greater electron spin perpendicular to the surface of the layer, thereby increasing its perpendicular magnetic anisotropy, and/or (2) can further enhance the sensitivity to the application of an electrical potential difference.

Figure 7A:
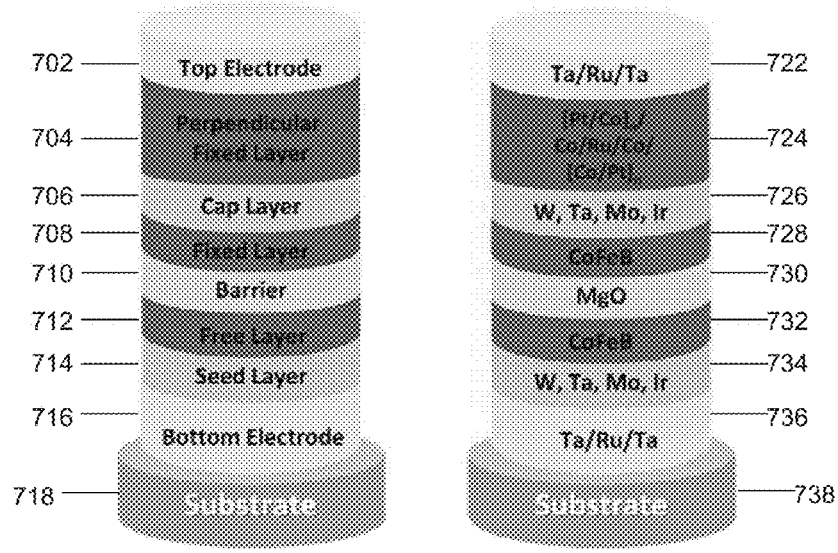
FIG. 7A conceptually illustrates a MEJ that includes adjunct layers to facilitate its operation in accordance with embodiments of the invention.

FIG. 7A conceptually illustrates MEJ structures 700 that include multiple layers that can work in aggregate to facilitate the functionality of the MEJ 700. In several embodiments, a pillar section extends from a substrate section 718, 738. In many embodiments, a voltage is applied between the top and bottom of the pillar. In certain embodiments, a pillar may comprise layers in a certain order type and materials: a top electrode 702 (e.g. Ta/Ru/Ta 722), perpendicular fixed layer 704 (e.g. Pt/Co, Co/Ru/Co, Co/Pt 724), cap layer 706 (e.g. W, Ta, Mo, Ir 726), fixed layer 708 (e.g. CoFeB 730), barrier 710 (e.g. MgO 730), free layer 712 (e.g. CoFeB 732), seed layer 714 (e.g. W, Ta, Mo, Ir 734), and bottom electrode 716 (e.g. Ta/Ru/Ta 736), although those skilled in the art will recognize that this layer order can be adjusted based on the specific requirements of the application.

Figure 7B:
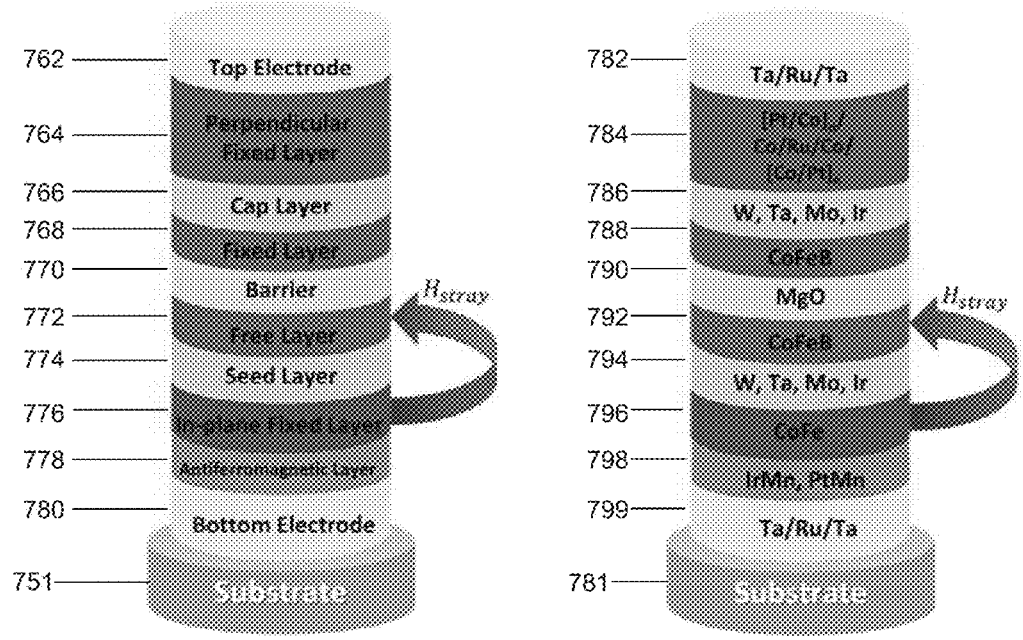
FIG. 7B conceptually illustrates a MEJ that includes adjunct layers that generate stray magnetic fields to facilitate its operation in accordance with embodiments of the invention.

FIG. 7B conceptually illustrates MEJ structures 750 wherein the in-plane fixed layer provides an in-plane stray field for achieving voltage-controlled precessional switching. In a number of embodiments, the stray field effects of the in-plane fixed layer allows the MEJ to function without the need for an externally applied magnetic field. In numerous embodiments, a pillar section extends from a substrate section 751, 781. In still numerous embodiments, a pillar may comprise layers in a certain order type and materials: a top electrode 762 (e.g. Ta/Ru/Ta 782), perpendicular fixed layer 764 (e.g. Pt/Co, Co/Ru/Co, Co/Pt 784), cap layer 766

(e.g. W, Ta, Mo, Ir 786), fixed layer 768 (e.g. CoFeB 788), barrier 770 (e.g. MgO 790), free layer 772 (e.g. CoFeB 792), seed layer 774 (e.g. W, Ta, Mo, Ir 794), in-plane fixed layer 776 (e.g. CoFe 796), antiferromagnetic layer 778 (e.g. IrMn, PtMn 798), and bottom electrode 780 (e.g. Ta/Ru/Ta 799), although those skilled in the art will recognize that this layer order can be adjusted based on the specific requirements of the application.

Although specific conceptual embodiments are described above for adjunct layers on a MEJ with reference to FIG. 7A-B, any of a number of FM layers in MEJ systems can be utilized as appropriate to the requirements of specific applications in accordance with various embodiments of the invention. For example, in numerous embodiments materials based on ruthenium, hafnium, and palladium, may be used as cap and seed layers. A discussion on the general principles of operation for a MEJ in accordance with several embodiments of the invention is discussed further below.

General Principles of MEJ Operation

MEJ operating principles—as they are currently understood—are now discussed. Note that embodiments of the invention are not constrained to the particular realization of these phenomena. Rather, the presumed underlying physical phenomena are being presented to inform the reader as to how MEJs are believed to operate. MEJs generally function to achieve two distinct states using the principles of magnetoresistance. As mentioned above, magnetoresistance principles regard how the resistance of a thin film structure that includes alternating layers of ferromagnetic and nonmagnetic layers depends upon whether the ferromagnetic layers are in a substantially parallel or antiparallel alignment. Thus, a MEJ can achieve a first state where its FM layers have magnetization directions that are substantially parallel, and a second state where its FM layers have magnetization directions that are substantially antiparallel.

MEJs further rely on voltage-controlled magnetic anisotropy (VCMA) phenomena. Generally, VCMA phenomena regard how the application of a voltage to a ferromagnetic material that is adjoined to an adjacent dielectric layer can impact the characteristics of the ferromagnetic material's magnetic anisotropy. For example, it has been demonstrated that the interface of oxides such as MgO with metallic ferromagnets such as Fe, CoFe, and CoFeB can exhibit a large perpendicular magnetic anisotropy which is furthermore sensitive to voltages applied across the dielectric layer. This effect has been attributed to spin-dependent charge screening, hybridization of atomic orbitals at the interface, and to the electric field induced modulation of the relative occupancy of atomic orbitals at the interface. In many embodiments, MEJs can exploit this phenomenon to achieve two distinct states. For example, MEJs can employ one of two mechanisms to do so.

First, in several embodiments of the invention, MEJs can be configured such that the application of a potential difference across the MEJ functions to reduce the coercivity of the FM free layer, such that it can be subject to magnetization in a desired magnetic direction. In certain embodiments, these directions may include being either substantially parallel with or antiparallel with the magnetization direction of the fixed layer. Second, in additional embodiments of the invention, MEJ operation can rely on precessional switching (or resonant switching), whereby by precisely subjecting the MEJ to voltage pulses of precise duration, the direction of magnetization of the FM free layer can be made to switch.

In a number of embodiments, MEJ operation is based on reducing the coercivity of the FM free layer such that it can adopt a desired magnetization direction. With a reduced coercivity, the FM free layer can adopt a magnetization direction in any suitable way. In multiple embodiments, the magnetization can result from an externally applied magnetic field, the magnetic field of the FM fixed layer, and/or the application of a spin-transfer torque (STT) current. In additional embodiments, the magnetization can further result from the magnetic field of a FM semi-fixed layer, the application of a current in an adjacent metal line inducing a spin-orbit torque (SOT), and/or any combination of these mechanisms. Indeed, such magnetization may occur from any suitable method of magnetizing the FM free layer with a reduced coercivity.

By way of example and not limitation, suitable ranges for the externally applied magnetic field are in the range of 0 to 100 Oe. However, in cases involving voltage induced precessional switching, to achieve a 1 nanosecond switching speed, the externally applied magnetic field should be approximately 200 Oe. The magnitude of the electric field applied across the device to reduce its coercivity or bring about resonant switching can be approximately in the range of 0.1-2.0 V/nm, with lower electric fields required for materials combinations that exhibit a larger VCMA effect. The magnitude of the STT current used to assist the switching may be in the range of approximately 0.1-1.0 MA/cm$^2$.

Figure 8A:
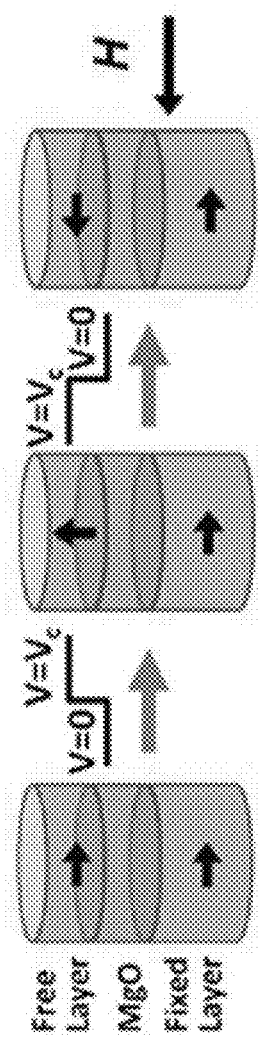
FIGS. 8A and 8B conceptually illustrate the operation of a MEJ in accordance with certain embodiments of the invention.

FIG. 8A conceptually illustrates how the application of a potential difference can reduce the coercivity of the free layer such that an externally applied magnetic field H can impose a magnetization switching on the free layer. In the illustration, in step 1, the FM free layer and the FM fixed layer have a magnetization direction that is substantially in plane, meaning that the FM free layer has a magnetization direction that is parallel with that of the FM fixed layer. Further, in Step 1, the coercivity of the FM free layer is such that the FM free layer is not prone to having its magnetization direction reversed by the magnetic field H, which is in a direction antiparallel with the magnetization direction of the FM fixed layer. However, a voltage, $V_c$ is then applied, which results in step 2, where the voltage $V_c$ has magnified the perpendicular magnetization direction component of the free layer (out of its plane). Correspondingly, the coercivity of the FM free layer is reduced such that it is subject to magnetization by an in-plane magnetic field H. Accordingly, when the potential difference $V_c$ is removed, VCMA effects are removed and the magnetic field H, which is substantially anti-parallel to the magnetization direction of the FM fixed layer, causes the FM free layer to adopt a direction of magnetization that is antiparallel with the magnetization direction of the FM fixed layer. Hence, as the MEJ now includes a FM fixed layer and a FM free layer that have magnetization directions that are antiparallel, it reads out a second information state (resistance value) different from the first. In general, it should be understood that in many embodiments where the magnetization directions of the free layer and the fixed layer are substantially in-plane, the application of a voltage enhances the perpendicular magnetic anisotropy such that the FM free layer can be caused to adopt an out-of-plane direction of magnetization. The magnetization direction can thereby be made to switch. In general, it can be seen that by controlling the potential difference and the direction of an applied external magnetic field, a MEJ switch can be achieved.

Figure 8B:
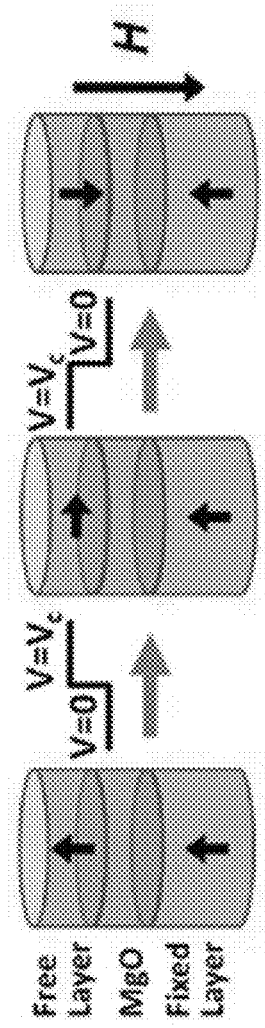

It should of course be understood that the direction of the FM fixed layer's magnetization direction need not be in-plane—it can be in any suitable direction. For instance, in certain embodiments, the magnetization can be substantially out of plane. Additionally, in many embodiments, the FM free layer can include both in-plane and out-of-plane magnetic anisotropy directional components. FIG. 8B depicts a corresponding case relative to FIG. 5A wherein the FM fixed and FM free layers have magnetization directions that are perpendicular to the layers of the MEJ (out-of-plane). It is of course important, that a FM, magnetically anisotropic free layer be able to adopt a magnetization direction that is either substantially parallel with an FM fixed layer, or substantially antiparallel with an FM fixed layer. In other words, when unburdened by a potential difference, the FM free layer can adopt a direction of magnetization that is either substantially parallel with or antiparallel with the direction of the FM fixed layer's magnetization to the extent that a distinct measurable difference in the resistance of the MEJ can be measured as two discrete information states.

Although specific conceptual illustrations are described regarding MEJ operation with respect to FIGS. 8A-B, any of a number of operation methods for MEJ systems can be utilized as appropriate to the requirements of specific applications in accordance with various embodiments of the invention. A discussion about utilizing semi-fixed layers in MEJs is covered in the following section.

Utilizing Semi-Fixed Layers in Magneto-Electric Junctions

In a number of embodiments, MEJs can also include a semi-fixed layer that can have a magnetic anisotropy that is altered by the application of a potential difference. In many embodiments, the characteristic magnetic anisotropy of the semi-fixed layer is a function of the applied voltage. For example, the direction of the magnetization of the semi-fixed layer can be oriented in the plane of the layer in the absence of a potential difference across the MEJ. However, when a potential difference is applied in several embodiments of the invention, the magnetic anisotropy is altered such that the magnetization may include a strengthened out-of-plane component. Moreover, in several embodiments the magnetic anisotropy of the semi-fixed layer may be modified by an applied voltage. Furthermore, the amount of modification of the semi-fixed layer in the presence of the applied voltage may also be less than free layer magnetic anisotropy is modified as a function of the same applied voltage. In additional embodiments, the incorporation of a semi-fixed layer can facilitate a more nuanced operation of the MEJ (to be discussed below in the section entitled "MEJ Operating Principles").

Figure 9A:
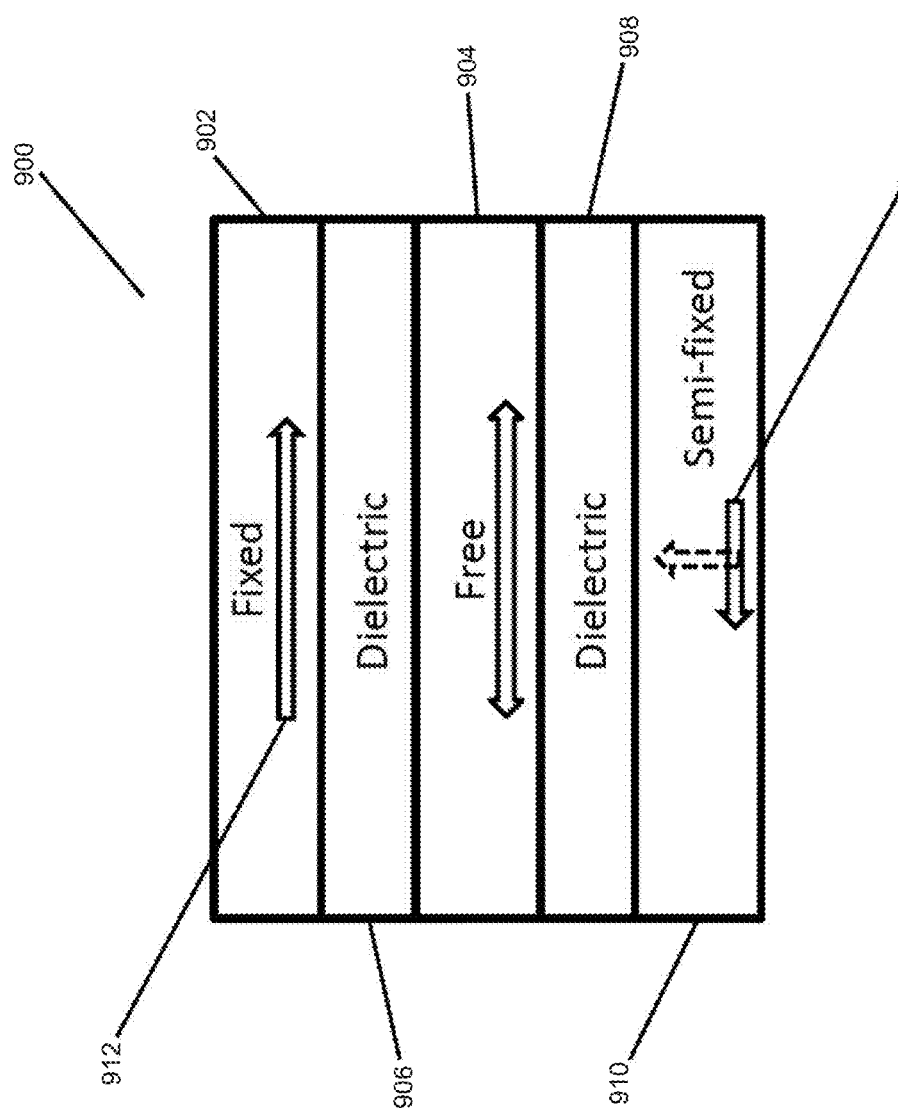
FIGS. 9A and 9B conceptually illustrate MEJs that include a semi-fixed layer in accordance with certain embodiments of the invention.

FIG. 9A conceptually illustrates a MEJ that includes a semi-fixed layer. In particular, the configuration of the MEJ 900 is similar to that depicted in FIG. 5, insofar as it includes a FM fixed layer 902 and a FM free layer 904 separated by a dielectric layer 906. However, in several embodiments, the MEJ 900 further includes a second dielectric layer 908 adjoined to the FM free layer 404 such that the FM free layer is adjoined to two dielectric layers, 906 and 908 respectively, on opposing sides. Further, in many embodiments, a semi-fixed layer 910 is adjoined to the dielectric layer. Typically, in many embodiments, the direction of magnetization of the semi-fixed layer 914 is antiparallel with that of the FM fixed layer 912. As mentioned above, the direction of magnetization of the semi-fixed layer can be manipulated based on the application of a voltage in accordance with a number of embodiments of the invention. In this illustration for example, it is depicted that the application of a potential difference adjusts the magnetic anisotropy of the semi-fixed layer such that the strength of the magnetization along a direction orthogonal to the initial direction of magnetization (in this case, out of the plane of the layer) is developed. It should of course be noted that the application of a potential difference could augment the magnetic anisotropy in any number of ways; for instance, in certain embodiments of MEJs, the application of a potential difference can reduce the strength of the magnetization in a direction orthogonal to the initial direction of magnetization. Note also that in the illustration, the directions of magnetization are all depicted to be in-plane where there is no potential difference. However, it should be understood that the direction of the magnetization can be in any suitable direction.

A particular configuration of a MEJ that includes a semi-fixed layer is depicted in FIG. 4A, however it should be understood that a semi-fixed layer can be incorporated within a MEJ in any number of configurations. For example, FIG. 9B conceptually illustrates a MEJ that includes a semi-fixed layer that is in a different configuration than that seen in 9A. In several embodiments, the positioning of the semi-fixed layer 964 and the free layer 954 is inverted of the MEJ 950. In certain situations, such a configuration may be more desirable.

Figure 9B:
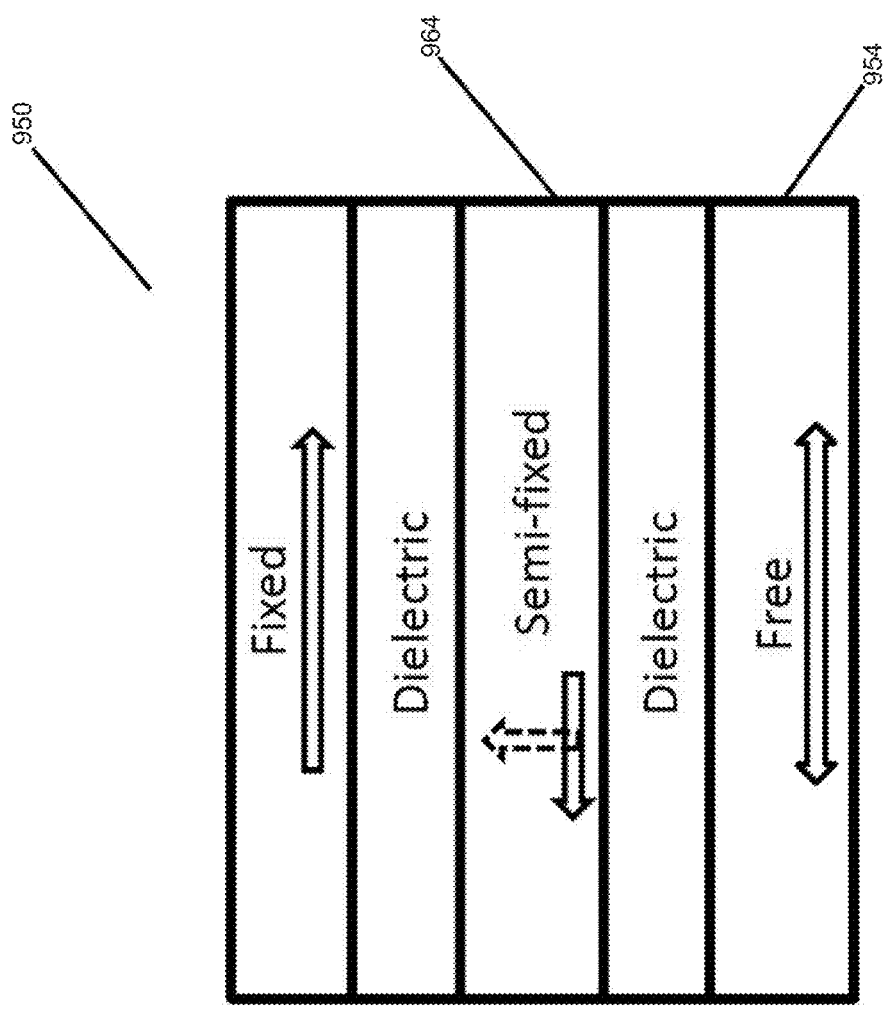

Although specific conceptual illustrations are described above for utilizing semi-fixed layers in a MEJ with reference to FIGS. 9A-B, any of a number of semi-fixed layers in MEJ systems can be utilized as appropriate to the requirements of specific applications in accordance with various embodiments of the invention. A discussion on utilizing metallic lines in of the operation of a MEJ are discussed in the following section.

Utilizing Metallic Lines in MEJs

Note of course that the application of an externally applied magnetic field is not the only way for the MEJ to take advantage of reduced coercivity upon application of a potential difference. In many embodiments, the magnetization of the FM fixed layer can be used to impose a magnetization direction on the free layer when the free layer has a reduced coercivity. Moreover, in several embodiments a MEJ can be configured to receive a spin-transfer torque (STT) current when application of a voltage causes a reduction in the coercivity of the FM free layer. Generally, certain embodiments include STT current as a spin-polarized current that can be used to facilitate the change of magnetization direction on a ferromagnetic layer. In a number of embodiments, this current can be passed directly through the MEJ device, such as due to leakage when a voltage is applied, or it can be created by other means. In several embodiments, these means can include spin-orbit-torques (e.g., Rashba or Spin-Hall Effects) or when a current is passed along a metal line placed adjacent to the FM free layer. Accordingly, a spin orbit torque current can then help cause the FM free layer to adopt a particular magnetization direction, where the direction of the spin orbit torque may determine the direction of magnetization. This configuration is advantageous over conventional STT-RAM configurations since the reduced coercivity of the FM free layer reduces the amount of current required to cause the FM free layer to adopt a particular magnetization direction, thereby making the device more energy efficient.

Additionally, in many embodiments, a MEJ cell can further take advantage of thermally assisted switching (TAS) principles. Generally, in numerous embodiments, in accordance with TAS principles, heating up the MEJ during a writing process may reduce the magnetic field required to induce switching. Thus, where STT is employed in accordance with several embodiments of the invention, even less current may be required to help impose a magnetization direction change on a free layer, particularly where VCMA principles have been utilized to reduce its coercivity.

Moreover, in numerous embodiments, the switching of MEJs to achieve two information states can also be achieved using voltage pulses. In particular, when voltage pulses are imposed on the MEJ for a time period that is one-half of the precession of the magnetization of the free layer, then the magnetization may invert its direction. Using this technique in certain embodiments of the invention, ultrafast switching times, e.g. below 1 ns, can be realized. Moreover, in additional embodiments using voltage pulses as opposed to a current makes this technique more energy efficient as compared to precessional switching induced by STT currents, as is often used in STT-RAM. However, this technique may be subject to the application of a precise pulse that is half the length of the precessional period of the magnetization layer. For instance, it has been observed that pulse durations in the range of 0.05 to 3 nanoseconds can reverse the magnetization direction. Additionally, the voltage pulse must be of suitable amplitude to cause the desired effect, e.g. reverse the direction of magnetization.

Based on this background, it can be seen that MEJs in accordance with embodiments of the invention can confer numerous advantages relative to conventional MTJs. For example, many embodiments can be controlled using voltages of a single polarity—indeed, the '739 patent, incorporated by reference above, discusses using diodes, in lieu of transistors, as access devices to the MEJ, and this configuration is enabled because MEJs can be controlled using voltage sources of a single polarity. In various embodiments, the charge current, spin current, and spin-polarization are all orthogonal to each other.

Figure 10:
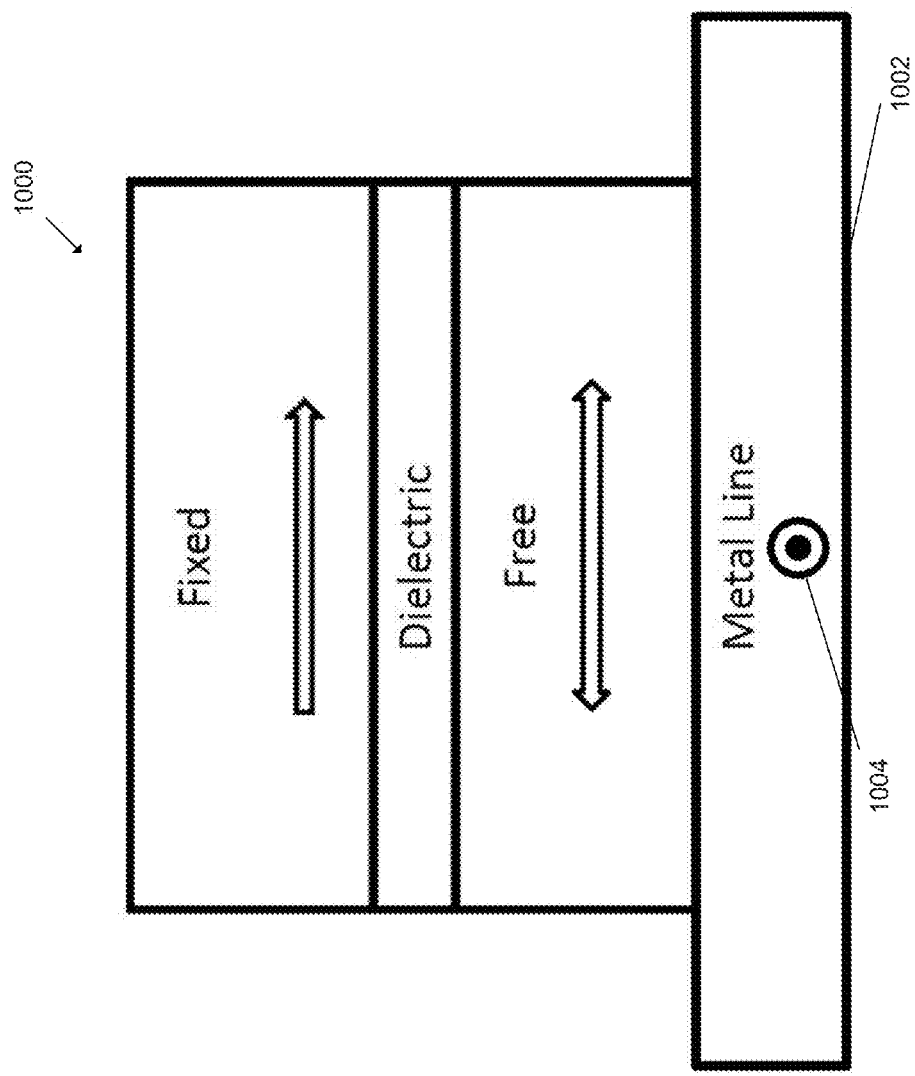
FIG. 10 conceptually illustrates a MEJ having a metal line parallel to and proximate the free layer where current can pass through the metal line and thereby induce spin-orbit torques that can cause the ferromagnetic free layer to adopt a particular magnetization direction in accordance with certain embodiments of the invention.

FIG. 10 conceptually illustrates using a metal line disposed adjacent to an FM free layer to generate spin-orbit torques that can impose a magnetization direction change on the FM free layer in accordance with several embodiments of the invention. In particular, the MEJ 1000 may be similar to that seen in FIG. 5, except that it further includes a metal line 1002, whereby a current 1004 can flow to induce spin-orbit torques, thereby helping to impose a magnetization direction change on the ferromagnetic free layer.

Although specific conceptual embodiments are described above regarding utilizing a metal line with MEJs with respect to FIG. 10, any of a number of methods to utilize a metal line adjacent to a MEJ system can be utilized as appropriate to the requirements of specific applications in accordance with various embodiments of the invention. A discussion about utilizing a plurality of MEJs in a configuration is covered in the following section.

Although the present invention has been described in certain specific aspects, many additional modifications and variations would be apparent to those skilled in the art. It is therefore to be understood that the present invention may be practiced otherwise than specifically described, including various changes in the implementation, without departing from the scope and spirit of the present invention. Additionally, the figures and methods described herein can also be better understood through the attached documentation the disclosure of which is hereby incorporated by reference in its entirety. Thus, embodiments of the present invention should be considered in all respects as illustrative and not restrictive.

What is claimed is:

1. A magnetoelectric random access memory circuit, comprising,
   a plurality of voltage controlled magnetic tunnel junction bits wherein each magnetoelectric junction comprises:
      at least one free magnetic layer;
      one fixed magnetic layer; and
      one dielectric interposed between the two magnetic layers;
   wherein application of a voltage with a given polarity to the magnetoelectric junction reduces the perpendicular magnetic anisotropy and the magnetic coercivity of the free layer through the voltage controlled magnetic anisotropy (VCMA) effect;
   wherein application of a voltage with opposite polarity increases the perpendicular magnetic anisotropy and magnetic coercivity of the free layer through the VCMA effect;
   wherein each magnetoelectric junction is connected to the drain of an MOS transistor, the combination comprising a MeRAM cell;
   wherein each MeRAM cell comprises three terminals, each connected respectively to a bit line, a source line, and at least one word line, in an array; and
   a driver circuit, comprising:
      a bit line driver; and
      a word line driver wherein a pulse generator can trigger the word line driver;
   wherein each bit line driver and word line driver is controlled by complimentary signals;
   wherein the bit line driver comprises a plurality of pull-up circuits; and
   the word line driver consists of a n-channel MOS transistor and a p-channel MOS transistor,
   wherein each of the plurality of pull-down circuits of the bit line driver and the word line driver also consist of two n-channel MOS transistors, and
   wherein the driver circuit generates voltage pulses for application to the magnetoelectric junction bit, wherein the output of the driver circuit is connected to the word line, which in turn is connected to the gate of the MOS access transistor in each MeRAM cell, thereby generating a square voltage pulse across the magnetoelectric junction bit.

2. The magnetoelectric random access memory circuit of claim 1, where the magnetoelectric junction bit free layer comprises a combination of Co, Fe and B.

3. The magnetoelectric random access memory circuit of claim 1, where the magnetoelectric junction bit dielectric barrier comprises MgO.

4. The magnetoelectric random access memory circuit of claim 2, where the magnetoelectric junction bit free layer is placed adjacent to a metal layer, comprising one or a combination of the elements Ta, Ru, Mn, Pt, Mo, Ir, Hf, W, and Bi.

5. The magnetoelectric random access memory circuit of claim 1, wherein the free layer magnetization changes direction in response to a voltage pulse across the magnetoelectric junction bit, which is timed to approximately half the ferromagnetic resonance period of the free layer.

6. The magnetoelectric random access memory circuit of claim 5, wherein the free layer magnetization has two stable states which are perpendicular to plane in the absence of voltage.

7. The magnetoelectric random access memory circuit of claim 5, wherein the free layer magnetization has two stable states which are in plane in the absence of voltage.

8. The magnetoelectric random access memory circuit of claim 5, wherein the magnetoelectric junction bit has a circular shape.

9. The magnetoelectric random access memory circuit of claim 5, wherein the magnetoelectric junction bit has an elliptical shape.

10. The magnetoelectric random access memory circuit of claim 1, where the driver circuit comprises the bit line driver, word line driver, and pulse generator.

11. The magnetoelectric random access memory circuit of claim 10, where the bit line driver has the pull-up circuit, comprising an n-channel MOS transistor and a p-channel MOS transistor, and the pull-down circuit, comprising two n-channel transistors.

12. The magnetoelectric random access memory circuit of claim 10, where the word line driver has the pull-up circuit, comprising an n-channel MOS transistor and a p-channel MOS transistor, and the pull-down circuit, comprising two n-channel transistors.

13. The magnetoelectric random access memory circuit of claim 11, where the bit line driver is controlled by complementary signals.

14. The magnetoelectric random access memory circuit of claim 12, where the word line driver is controlled by complementary signals, which are created by the pulse generator.

15. The magnetoelectric random access memory circuit of claim 14, the pulse generator creates complementary signals whose width are adjustable via a digital code.

16. The magnetoelectric random access memory circuit of claim 10, the output of the bit line driver is connected to the bit line.

17. The magnetoelectric random access memory circuit of claim 11, the output of the word line driver is connected to the word line.

* * * * *